United States Patent
Lee et al.

(10) Patent No.: US 11,903,292 B2
(45) Date of Patent: Feb. 13, 2024

(54) ORGANIC LIGHT EMITTING DISPLAY DEVICE AND METHOD FOR MANUFACTURING THE SAME

(71) Applicant: LG Display Co., Ltd., Seoul (KR)

(72) Inventors: JoongHa Lee, Paju-si (KR); DongKyu Lee, Paju-si (KR); BooYoung Kim, Paju-si (KR); YoungJun Hong, Paju-si (KR); Onesouk Cho, Paju-si (KR); SeongHoon Kim, Goyang-si (KR); SeYoung Kim, Seoul (KR); Jaehwan Yun, Paju-si (KR); WonGyu Jeong, Paju-si (KR); WooJin Sim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 242 days.

(21) Appl. No.: 17/370,568

(22) Filed: Jul. 8, 2021

(65) Prior Publication Data
US 2022/0013589 A1     Jan. 13, 2022

(30) Foreign Application Priority Data

Jul. 13, 2020 (KR) .......................... 10-2020-0085858

(51) Int. Cl.
*H10K 59/40* (2023.01)
*H10K 50/842* (2023.01)
(Continued)

(52) U.S. Cl.
CPC ......... *H10K 59/40* (2023.02); *H10K 50/8426* (2023.02); *H10K 59/131* (2023.02); *H10K 71/00* (2023.02); *H10K 59/1201* (2023.02)

(58) Field of Classification Search
CPC .. H10K 59/40; H10K 50/8426; H10K 59/131; H10K 71/00; H10K 59/1201;
(Continued)

(56) References Cited

U.S. PATENT DOCUMENTS 7,825,512 B2 * 11/2010 Liu ...................... H05K 3/3436
257/772
8,254,140 B2   8/2012 Lee et al.
(Continued)

FOREIGN PATENT DOCUMENTS

CN     104752484 A    7/2015
CN     106959793 A    7/2017
(Continued)

OTHER PUBLICATIONS

China National Intellectual Property Office, Office Action, Chinese Patent Application No. 202110783780.1, dated Aug. 7, 2023, 11 pages.

*Primary Examiner* — Kyoung Lee
(74) *Attorney, Agent, or Firm* — Fenwick & West LLP

(57) ABSTRACT

Provided is an organic light emitting display device. The organic light emitting display device includes a lower substrate including sub-pixels, a display area, a non-display area, and an exposed area; a lower touch pad unit in the non-display area and adjacent to the exposed area on the lower substrate; an upper substrate disposed opposite to the remaining area excluding the exposed area of the lower substrate; an upper touch pad unit on the upper substrate so as to correspond to the lower touch pad unit; a first connection electrode in direct contact with the lower touch pad unit; a second connection electrode opposite to the first connection electrode and in direct contact with the upper touch pad unit; and a self-assembly contact member disposed between the first connection electrode and the second connection electrode so as to electrically connect the first connection electrode and the second connection electrode.

16 Claims, 13 Drawing Sheets

(51) Int. Cl.
  *H10K 71/00* (2023.01)
  *H10K 59/131* (2023.01)
  *H10K 59/12* (2023.01)

(58) Field of Classification Search
  CPC ............... H10K 50/805; H10K 50/841; H10K 59/1275; G06F 2203/04103; G06F 2203/04111; G06F 3/0412; G06F 3/0443; G06F 3/0446; G06F 3/04164
  See application file for complete search history.

(56) References Cited

U.S. PATENT DOCUMENTS

| | | | |
|---|---|---|---|
| 9,501,165 B2 | 11/2016 | Kim et al. | |
| 9,952,723 B2 | 4/2018 | Park et al. | |
| 10,353,524 B2 | 7/2019 | Park et al. | |
| 10,474,263 B2 | 11/2019 | Jung et al. | |
| 10,747,073 B2 | 8/2020 | Cho et al. | |
| 2007/0057382 A1 | 3/2007 | Liu et al. | |
| 2009/0188704 A1 | 7/2009 | Lee et al. | |
| 2015/0145824 A1 | 5/2015 | Park et al. | |
| 2015/0185942 A1 | 7/2015 | Kim et al. | |
| 2017/0199608 A1* | 7/2017 | Jung | G06F 3/0412 |
| 2017/0357121 A1 | 12/2017 | Cho et al. | |
| 2018/0196551 A1 | 7/2018 | Park et al. | |
| 2020/0341321 A1 | 10/2020 | Cho et al. | |

FOREIGN PATENT DOCUMENTS

| | | |
|---|---|---|
| KR | 10-2009-0081472 A | 7/2009 |
| KR | 10-2011-0048686 A | 5/2011 |
| KR | 10-2014-0074123 A | 6/2014 |
| KR | 10-2015-0059331 A | 6/2015 |
| KR | 10-2017-0139217 A | 12/2017 |

\* cited by examiner

ORGANIC LIGHT EMITTING DISPLAY DEVICE AND METHOD FOR MANUFACTURING THE SAME

CROSS-REFERENCE TO RELATED APPLICATIONS

This application claims the priority of Republic of Korea Patent Application No. 10-2020-0085858 filed on Jul. 13, 2020, in the Korean Intellectual Property Office, the disclosure of which is hereby incorporated by reference in its entirety.

BACKGROUND

Field

The present disclosure relates an organic light emitting display device with an integrated touch screen and a method of manufacturing the same.

Description of the Related Art

Recently, as it enters an information era, a display field which visually expresses electrical information signals has been rapidly developed and in response to this, various display devices having excellent performances such as thin-thickness, light weight, and reduced power consumption have been developed.

Among them, the organic light emitting display device (OLED) is a self-emitting device and is attracting wide attention with advantages, such as a faster response speed, increased luminous efficiency, increased luminance, and a larger viewing angle as compared with the other display devices. Further, an organic light emitting diode which is applied to the organic light emitting display device is a next-generation light source having a self-luminous characteristic and has excellent advantages in terms of a viewing angle, a contrast, a response speed, and power consumption, as compared with liquid crystal.

In the meantime, there is an attempt to manufacture a transparent display device by utilizing the organic light emitting display device. The transparent organic light emitting display device is a display device which is capable of observing objects located at a rear side and includes a pixel area in which an organic light emitting diode emits light to display images and a transmissive area which transmits external light to implement a transparent display device.

In the meantime, in recent years, products which include a built-in touch sensor to have a touch screen function which is operated by touching a screen, such as a mobile device, a personal digital assistant (PDA), and a notebook which are personal portable devices, become indispensable. However, when a separate touch panel is attached on an outer surface of the organic light emitting display device, there are disadvantages in that an overall thickness of the organic light emitting display device is increased and the visibility of the image is degraded due to the increased thickness.

SUMMARY

An object to be achieved by the present disclosure is to provide an organic light emitting display device with a novel structure and a method of manufacturing the same to solve the problems of the related art.

Another object to be achieved by the present disclosure is to reduce the number of printed circuit boards.

Still another object to be achieved by the present disclosure is to provide a structure in which the cost of parts of the organic light emitting display device is reduced, and degrees of freedom of a design of the organic light emitting display device and placement of components are improved.

Objects of the present disclosure are not limited to the above-mentioned objects, and other objects, which are not mentioned above, can be clearly understood by those skilled in the art from the following descriptions.

According to an aspect of the present disclosure, an organic light emitting display device includes a lower substrate which including a plurality of sub-pixels and having a display area, a non-display area enclosing the display area, and an exposed area extending from one side of the non-display area; a lower touch pad unit formed in the non-display area so as to be adjacent to the exposed area on the lower substrate; an upper substrate disposed so as to be opposite to the remaining area excluding the exposed area of the lower substrate; an upper touch pad unit formed on the upper substrate so as to correspond to the lower touch pad unit; a first connection electrode formed so as to be in direct contact with the lower touch pad unit; a second connection electrode formed to be opposite to the first connection electrode and to be in direct contact with the upper touch pad unit; and a self-assembly contact member disposed between the first connection electrode and the second connection electrode so as to electrically connect the first connection electrode and the second connection electrode.

According to another aspect of the present disclosure, a manufacturing method of an organic light emitting display device includes preparing a lower substrate including a plurality of sub-pixels and having a display area, a non-display area enclosing the display area, and an exposed area extending from one side of the non-display area; forming a lower touch pad unit in the non-display area so as to be adjacent to the exposed area; forming an upper touch pad unit corresponding to the lower touch pad unit, a touch sensor corresponding to the display area, and a touch line connecting the touch sensor and the upper touch pad unit on an upper substrate; patterning a first connection electrode on the lower touch pad unit so as to be in contact with the lower touch pad unit and patterning a second connection electrode on the upper touch pad unit so as to be in contact with the upper touch pad unit; applying a self-assembly composition including solder particles on the lower touch pad unit; disposing and attaching the lower substrate and the upper substrate such that the first connection electrode and the second connection electrode are opposite to each other; and forming the self-assembly contact member between the lower touch pad unit and the upper touch pad unit by heating the self-assembly composition.

Other detailed matters of the exemplary embodiments are included in the detailed description and the drawings.

According to the present disclosure, a signal may be simultaneously transmitted to a thin film transistor disposed on a lower substrate and a touch sensor disposed on an upper substrate only by means of a printed circuit board disposed on the lower substrate.

Further, according to the present disclosure, the cost of the parts of the organic light emitting display device may be reduced and the design of the organic light emitting display device and the placement of the components may be more freely implemented.

Further, according to the present disclosure, a crack or a damage caused in a pillar-shaped electrode which connects pad units disposed up and down may be minimized.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
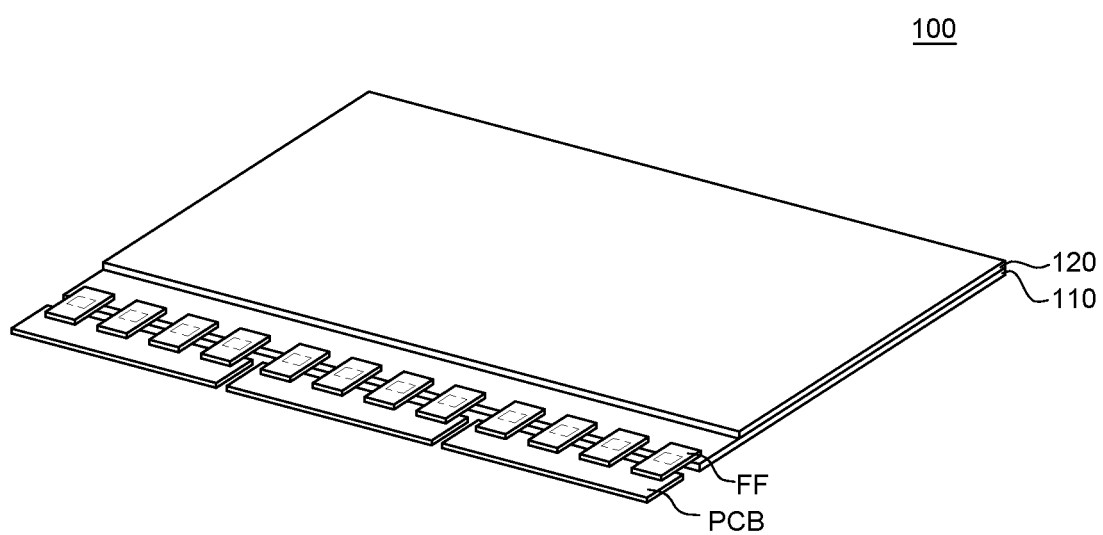
FIG. 1 is a schematic perspective view of an organic light emitting display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

FIG. 1 is a schematic perspective view of an organic light emitting display device according to an exemplary embodiment of the present disclosure.

Referring to FIG. 1, an organic light emitting display device 100 according to an exemplary embodiment of the present disclosure includes a lower substrate 110, an upper substrate 120, a flexible film FF, and a printed circuit board PCB.

The lower substrate 110 is a base substrate which supports various components of the organic light emitting display device 100 and may be an insulating substrate. For example, the lower substrate 110 may be configured by glass or plastic. In some exemplary embodiments, the lower substrate 110 may be formed of a material having flexibility to be bendable if necessary. For example, the lower substrate 110 may be a thin glass base material which satisfies flexibility or may be formed of a polymer material such as polyimide PI, but is not limited thereto. The lower substrate 110 and components disposed on the lower substrate 110 will be described below with reference to FIG. 5.

The upper substrate 120 is disposed opposite to the lower substrate 110 to support various components of the organic light emitting display device 100. The upper substrate 120 is an encapsulation plate to protect the organic light emitting diode from moisture, air, or physical impacts entering from the outside. For example, the upper substrate 120 may be disposed by any one of glass, a metal foil, a plastic film, and the like. The upper substrate 120 and components disposed on the upper substrate 120 will be described below with reference to FIG. 6.

The flexible film FF is disposed on a side surface of the lower substrate 110. The flexible film FF transmits various signals from the printed circuit board PCB to the lower substrate 110. In the flexible film FF, a driving circuit (for example, an IC chip) may be mounted. The driving circuit may generate a data signal or a gate signal corresponding to a driving power and various signals which are transmitted from the printed circuit board PCB and supply the data signal or the gate signal to a thin film transistor TFT formed on the lower substrate 110. To this end, the driving circuit may include both a data driver which generates a data signal and a gate driver which generates a scan signal, or the data driver and the gate driver may be separated from each other. In this case, the flexible film FF may transmit signals output from the printed circuit board PCB to the driving circuit or transmit signals output from the driving circuit to the thin film transistor TFT formed on the lower substrate 110. Even though in the present disclosure, it has been described that the driving circuit may be disposed on the flexible film FF, the driving circuit may be directly disposed on the lower substrate 110. The flexible film FF may be attached onto a connection pad unit PADS provided in a non-display area NDA of the lower substrate 110 using an anisotropic conducting film ACF.

The printed circuit board PCB is attached to the flexible film FF. Specifically, the printed circuit board PCB is attached to the other side of the flexible film FF based on one side of the flexible film FF at which the flexible film FF and the lower substrate are connected. The printed circuit board PCB transmits various signals to the thin film transistor TFT formed on the lower substrate 110 and a touch sensor 140 formed on the upper substrate 120. For example, a timing controller and the like may be disposed on the printed circuit board PCB. The timing controller may supply various signals to the driving circuit. For example, the timing controller generates a data driver control signal DDC, a gate driver control signal GDC, and the like to supply the signals to the driving circuit.

In the meantime, in the organic light emitting display device 100 according to the exemplary embodiment of the present disclosure, the flexible film FF and the printed circuit board PCB may be independently disposed. However, a flexible printed circuit board (FPCB) in which a separate flexible film FF and a separate printed circuit board PCB are not attached to each other, but the flexible film FF and the printed circuit board PCB are integrally formed so that the flexible film FF itself performs a function of the printed circuit board PCB may be used.

Figure 2:
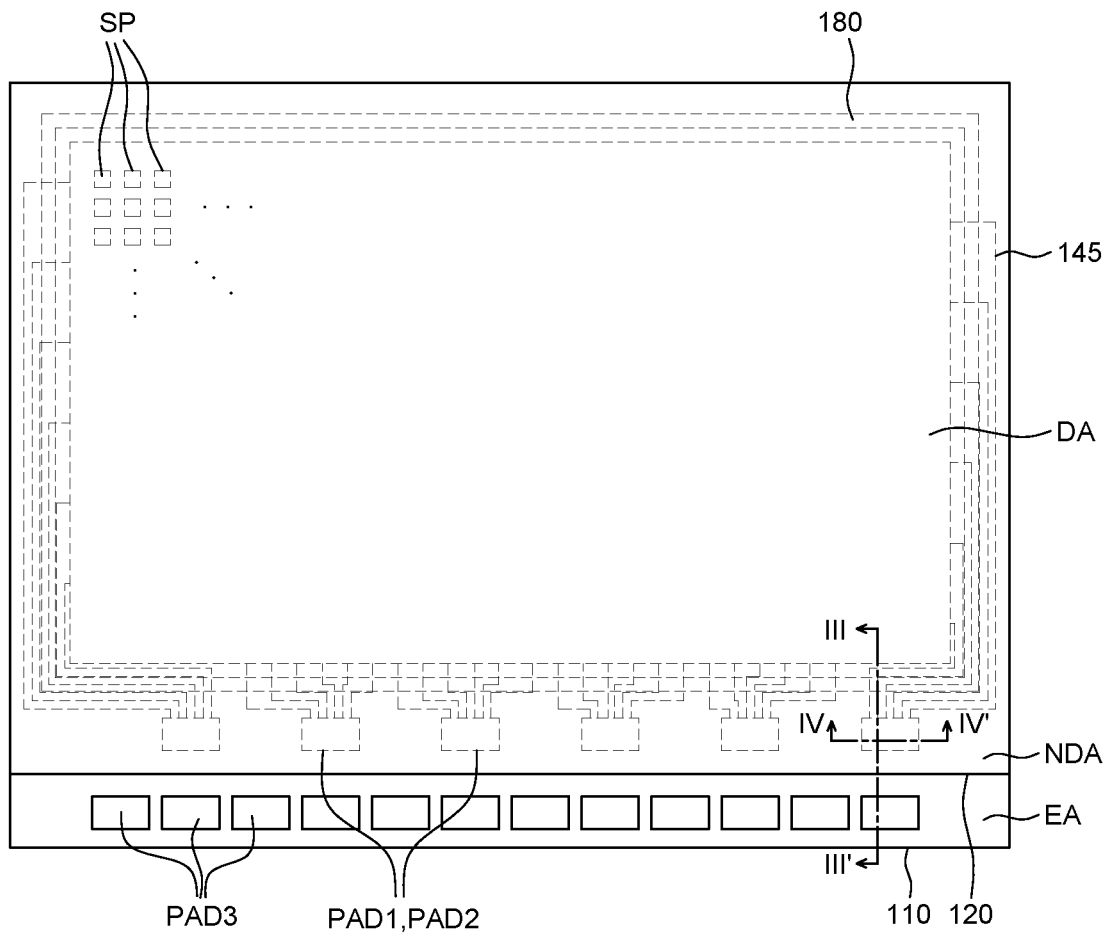
FIG. 2 is a schematic plan view of an organic light emitting display device according to an exemplary embodiment of the present disclosure.
Figure 3:
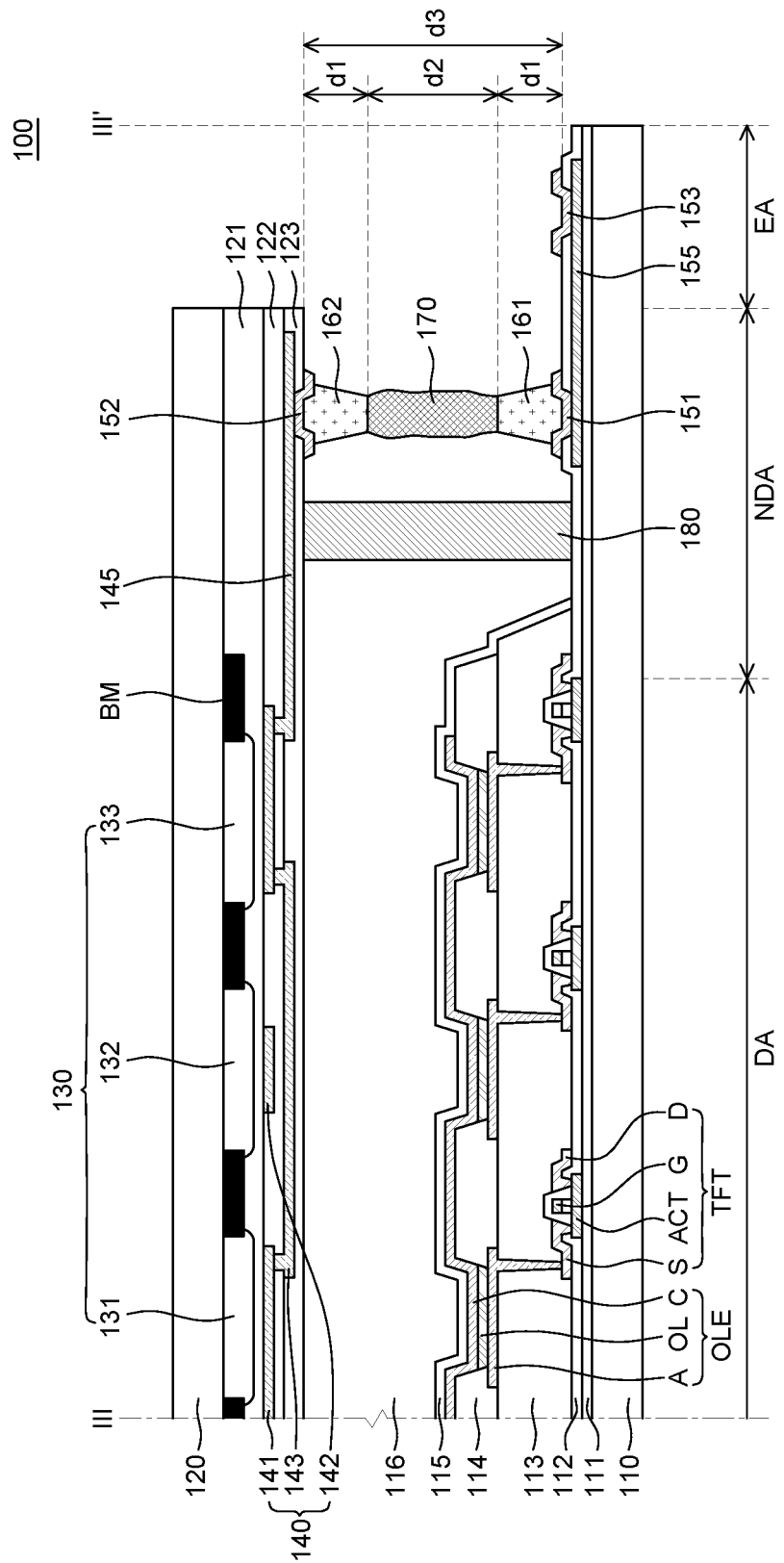
FIG. 3 is a schematic cross-sectional view taken along the line III-III' of FIG. 2 according to an exemplary embodiment of the present disclosure.
Figure 4:
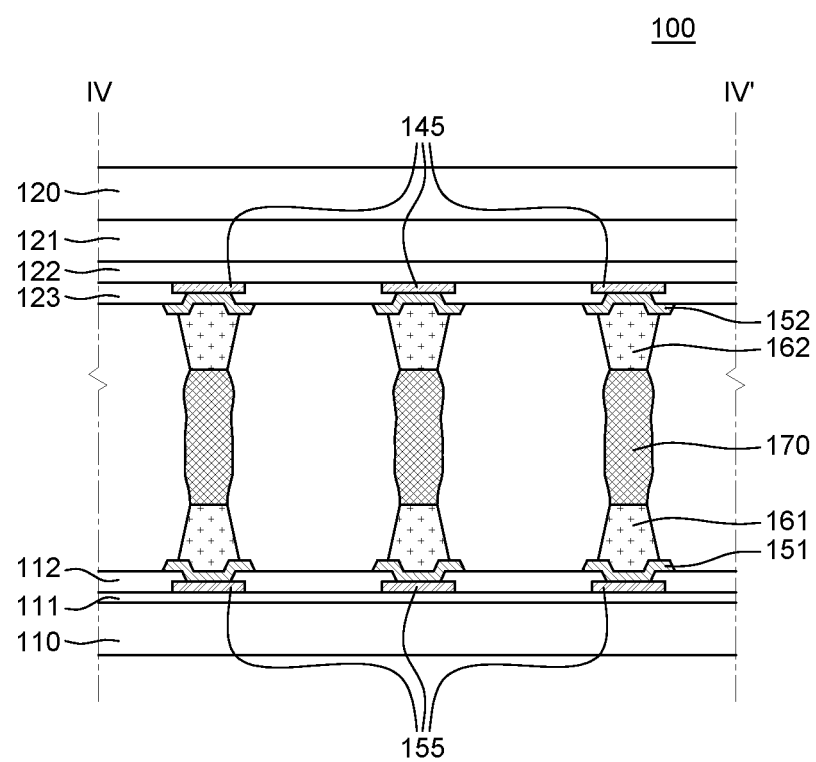
FIG. 4 is a schematic cross-sectional view taken along the line IV-IV' of FIG. 2 according to an exemplary embodiment of the present disclosure.
Figure 5:
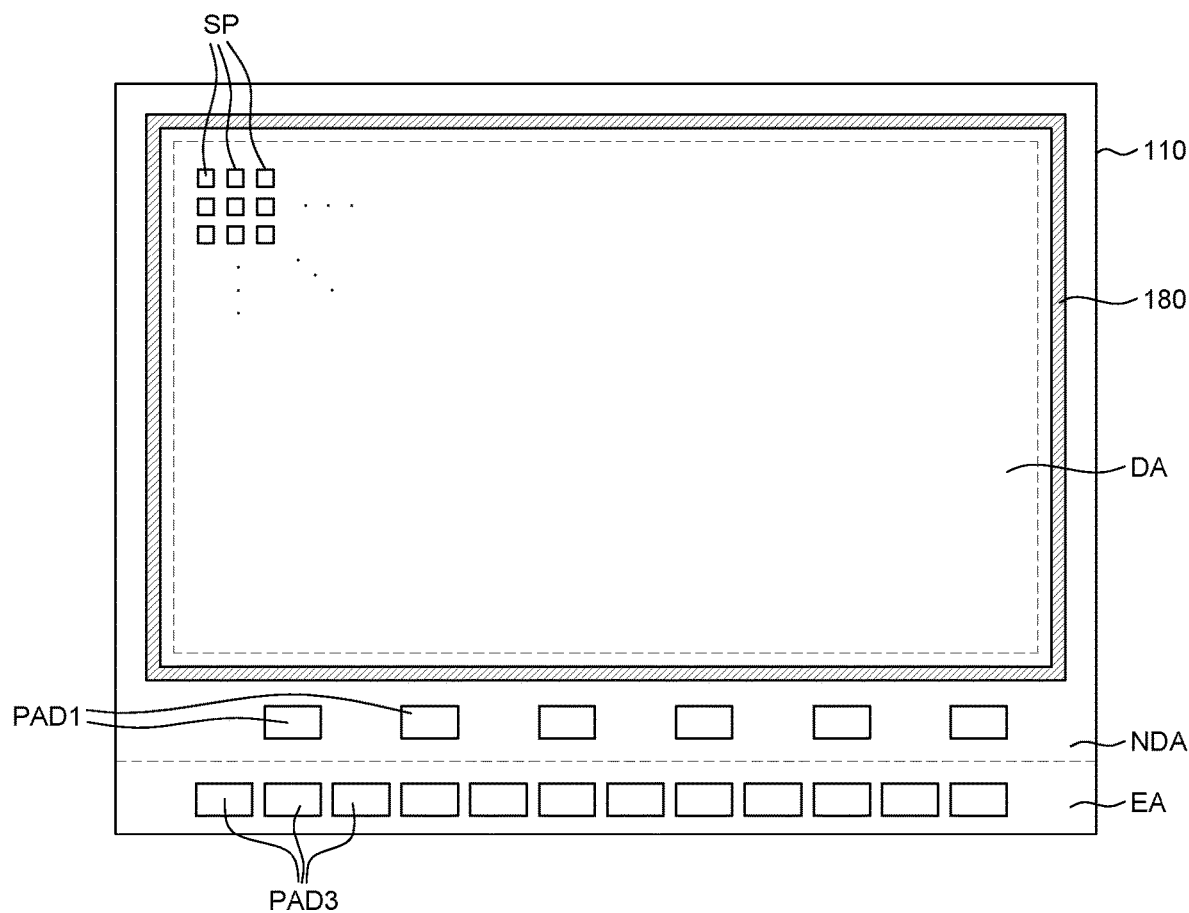
FIG. 5 is a schematic plan view of a lower substrate which configures an organic light emitting display device according to an exemplary embodiment of the present disclosure.
Figure 6:
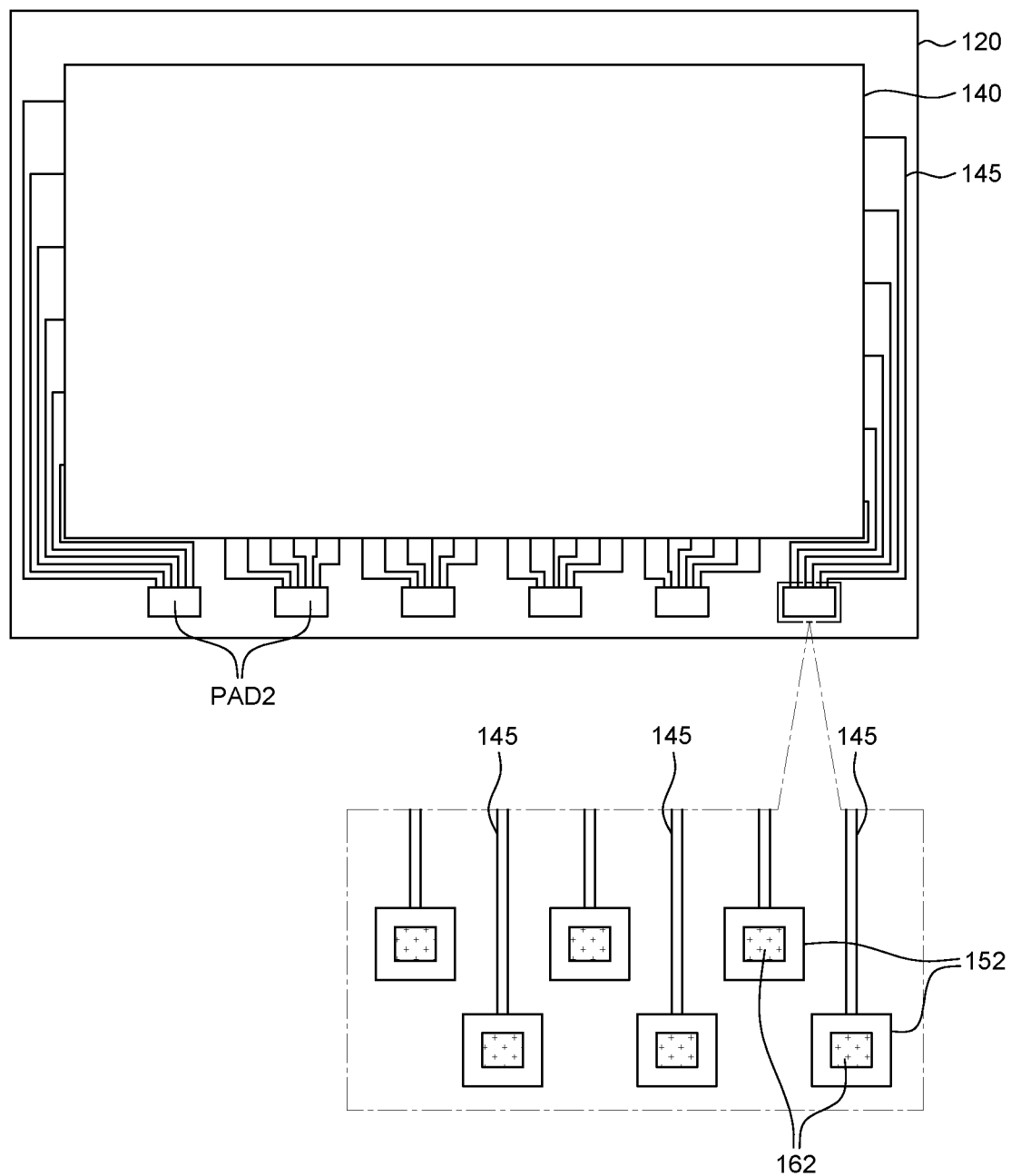
FIG. 6 is a schematic plan view of an upper substrate which configures an organic light emitting display device according to an exemplary embodiment of the present disclosure.

Hereinafter, the organic light emitting display device 100 according to the exemplary embodiment of the present disclosure will be described mainly with respect to the lower substrate 110 and the upper substrate 120. FIG. 2 is a schematic plan view of an organic light emitting display device according to an exemplary embodiment of the present disclosure. FIG. 3 is a schematic cross-sectional view of an organic light emitting display device taken along the line III-III' of FIG. 2 according to an exemplary embodiment of the present disclosure. FIG. 4 is a schematic cross-sectional view of an organic light emitting display device taken along the line IV-IV' of FIG. 2 according to an exemplary embodiment of the present disclosure. FIG. 5 is a schematic plan view of a lower substrate 110 which configures an organic light emitting display device 100 according to an exemplary embodiment of the present disclosure. FIG. 6 is a schematic plan view of an upper substrate which configures an organic light emitting display device according to an exemplary embodiment of the present disclosure. FIG. 2 is a schematic plan view of a state in which the lower substrate illustrated in FIG. 5 and the upper substrate illustrated in FIG. 6 are attached. Therefore, in FIG. 2, components which are formed below the upper substrate to overlap the upper substrate are illustrated with dotted lines and components which are disposed on the lower substrate, but do not overlap the upper substrate are illustrated with solid lines.

In the meantime, even though in the present specification, it has been described that various components are disposed on the upper substrate 120, the expression that it is disposed on the upper substrate 120 does not mean an absolute direction such as up/down. As it will be described below, the upper substrate 120 is attached to the lower substrate 110 so that when the upper substrate 120 and the lower substrate 110 are attached, a configuration disposed on the upper substrate 120 may be disposed simultaneously above the lower substrate 110 and below the upper substrate 120.

The organic light emitting display device 100 according to the exemplary embodiment of the present disclosure includes the lower substrate 110, the upper substrate 120, the thin film transistor TFT, an organic light emitting diode OLE, a black matrix BM, a color filter 130, a touch sensor 140, the flexible film FF, and the printed circuit board PCB.

Hereinafter, the lower substrate 110 and components formed on the lower substrate 110 will be described with reference to FIG. 5. In FIG. 5, among the components of the organic light emitting display device 100, only the lower substrate 110 and a lower touch pad unit PAD1 and a connection pad unit PADS formed on the lower substrate 110 are illustrated.

The lower substrate 110 is a base substrate which supports various components of the organic light emitting display device 100 and may be an insulating substrate. For example, the lower substrate 110 may be configured by glass or plastic. In some exemplary embodiments, the lower substrate 110 may be formed of a material having flexibility to be bendable if necessary. For example, the lower substrate 110 may be a thin glass base material which satisfies flexibility or may be formed of a polymer material such as polyimide (PI), but is not limited thereto.

Referring to FIG. 5, the lower substrate 110 includes a display area DA, a non-display area NDA, and an exposed area EA. The display area DA is an area of the organic light emitting display device 100 in which the image is displayed and refers to an area where a component such as a thin film transistor TFT or an organic light emitting diode OLE is formed. The non-display area NDA is an area of the organic light emitting display device 100 in which no image is displayed and even though not illustrated in FIG. 5, wiring lines or circuit units are formed therein. Referring to FIG. 5, the non-display area NDA encloses the display area DA. The display area DA and the non-display area NDA may have shapes suitable for a design of an electronic device including the organic light emitting display device 100. For example, the display area DA has various shapes such as a pentagon, a hexagon, a circle, or an oval and the non-display area NDA may have an arbitrary shape which encloses the display area DA. The exposed area EA is an area extending from one side of the non-display area NDA and refers to an area of the lower substrate 110 which is not covered by the upper substrate 120, but is exposed to the outside in a state in which the upper substrate 120 and the lower substrate 110 are attached.

A plurality of sub-pixels SP are defined in the display area DA of the lower substrate 110. Each of the plurality of sub-pixels SP is an area which displays one color and includes an area of the display area DA in which an organic light emitting diode OLE is disposed. The plurality of sub-pixels SP may be configured by a red sub-pixel, a green sub-pixel, and a blue sub-pixel or may be configured by a red sub-pixel, a green sub-pixel, a blue sub-pixel, and a white sub-pixel. The plurality of sub-pixels SP may be defined in the form of a matrix as illustrated in FIG. 5.

In the non-display area NDA of the lower substrate 110, a lower touch pad unit PAD1 is formed. The lower touch pad unit PAD1 is a pad unit which transmits a sensing signal from the touch sensor 140 formed on the upper substrate 120 to the printed circuit board PCB. The lower touch pad unit PAD1 is formed in the non-display area NDA to be adjacent to the exposed area EA. That is, the lower touch pad unit PAD1 is formed in the non-display area NDA between the display area DA and the exposed area EA. Even though in FIG. 5, for the convenience of description, it is illustrated that the lower touch pad unit PAD1 is formed at a lower edge of the lower substrate 110, the position of the lower touch pad unit PAD1 is not limited thereto. Further, even though in FIG. 5, it is illustrated that six lower touch pad units PAD1 are disposed, the shape, the number, etc. of lower touch pad units PAD1 are not limited to the exemplary embodiment illustrated in FIG. 5.

The lower touch pad unit PAD1 may be formed of a plurality of pad electrodes. Referring to FIG. 3, the lower touch pad unit PAD1 includes a lower touch pad electrode 151. The lower touch pad electrode 151 which configures the lower touch pad unit PAD1 may be formed of the same material as one of various conductive materials which configure the thin film transistor TFT and the organic light emitting diode OLE formed in the display area DA.

In the exposed area EA of the lower substrate 110, the connection pad unit PAD3 for connection with the flexible film FF is formed. The connection pad unit PAD3 includes a first connection pad unit which electrically connects a display unit of the display area DA and the flexible film FF and a second connection pad unit which connects the lower touch pad unit PAD1 of the non-display area NDA and the flexible film FF. In FIG. 5, the second connection pad unit is disposed so as to correspond to the lower touch pad unit PAD1 and the first connection pad unit is disposed between the second connection pad units. Even though in FIG. 5, it is illustrated that the first connection pad units and the second connection pad units are alternately repeatedly disposed, the placement of the first connection pad unit and the second connection pad unit is not limited thereto. Further, even though in FIG. 5, it is illustrated that six first connection pad units and six second connection pad units are disposed, the shapes, the number, etc. of the first connection pad units and the second connection pad units are not limited to the exemplary embodiment illustrated in FIG. 5.

The connection pad unit PAD3 may be formed of a plurality of pad electrodes. Referring to FIG. 3, the connection pad unit PAD3 includes the connection pad electrodes 153. The connection pad electrode 153 which configures the connection pad unit PAD3 may be formed of the same material as one of various conductive materials which configure the thin film transistor TFT and the organic light emitting diode OLE formed in the display area DA.

Even though not illustrated in FIG. 5, the lower touch pad unit PAD1 and the connection pad unit PAD3 may be connected by means of a separate wiring line. As described above, the lower touch pad unit PAD1 and the second connection pad unit PAD3 may be connected by means of a connection line 155. Specifically, referring to FIG. 3, the lower touch pad electrode 151 of the lower touch pad unit PAD1 is connected to the connection pad electrode 153 of the connection pad unit PAD3 by means of the connection line 155.

In the meantime, even though not illustrated in FIG. 5, a driving integrated circuit chip D-IC and various wiring lines may be formed.

Referring to FIG. 3, a first buffer layer 111 is formed on the lower substrate 110 to protect various components of the organic light emitting display device 100 from permeation of moisture $H_2O$ and hydrogen $H_2$ from the outside of the lower substrate 110. However, the first buffer layer 111 may be omitted depending on a structure or a characteristic of the organic light emitting display device 100.

On the first buffer layer 111, a thin film transistor TFT including a semiconductor layer ACT, a gate electrode G, a source electrode S, and a drain electrode D is disposed. For example, the semiconductor layer ACT is formed on the lower substrate 110 and the gate insulating layer 112 which insulates the gate electrode G from the semiconductor layer ACT is disposed on the semiconductor layer ACT and the lower substrate 110. The gate electrode G is formed on the gate insulating layer 112 and the source electrode S and the drain electrode D are formed on the semiconductor layer ACT and the gate insulating layer 112. The source electrode S and the drain electrode D are in contact with the semiconductor layer ACT to be electrically connected to the semiconductor layer ACT and are formed on a partial area of the gate insulating layer 112. In the present specification, for the convenience of description, among various thin film transistors TFT which may be included in the light emitting display device, only a driving thin film transistor TFT is illustrated, but a switching thin film transistor TFT may also be included. Further, in the present specification, even though it is described that the thin film transistor TFT has a coplanar structure, a thin film transistor TFT having an inverted staggered structure may also be used.

Even though it is not illustrated in FIG. 3, a passivation layer may be additionally disposed on the thin film transistor TFT to protect the thin film transistor TFT. In the passivation layer, a contact hole which exposes the source electrode S or the drain electrode D of the thin film transistor TFT may be formed. The passivation layer may be configured as a single layer or a multi-layer of silicon nitride SiNx or silicon oxide SiOx.

A planarization layer 113 is disposed on the passivation layer to planarize an upper portion of the thin film transistor TFT. In the planarization layer 113, a contact hole which exposes the source electrode S or the drain electrode D of the thin film transistor TFT is formed. The planarization layer 113 may be formed of any one of an acrylic resin, an epoxy resin, a phenol resin, a polyamide resin, a polyimide resin, an unsaturated polyester resin, a polyphenylene resin, a polyphenylene sulfide resin, benzocyclobutene, and a photoresist, but is not limited thereto.

The organic light emitting diode OLE is disposed on the planarization layer 113. The organic light emitting diode OLE is electrically connected to the thin film transistor TFT and includes an anode A, an organic light emitting layer OL, and a cathode C.

The anode A is disposed on the planarization layer 113. The anode A is disposed on the planarization layer 113 to be electrically connected to the source electrode S or the drain electrode D through the contact hole formed in the planarization layer 113. The anode A is an electrode configured to supply holes to the organic light emitting layer OL. The anode A may be configured by a transparent conductive material having a high work function. Here, the transparent conductive material may include indium tin oxide (ITO), indium zinc oxide (IZO), or indium tin zinc oxide (ITZO). When the organic light emitting display device 100 is a top emission type, the anode A may further include a reflector. The anodes A may be formed to be spaced apart from each other for every sub-pixel SP.

The bank 114 is disposed on the anode A and the planarization layer 113. The bank 114 may cover an edge of the anode A of the organic light emitting diode OLE to define an emission area. The bank 114 may be formed of an insulating material which insulates anodes A of adjacent sub-pixels SP from each other. Further, the bank 114 may be configured by a black bank having high light absorptance to suppress color mixture between adjacent sub-pixels SP. For example, the bank 114 may be formed of a polyimide resin, an acrylic resin, or a benzocyclobutene resin, but is not limited thereto.

The cathode C is disposed on the anode A. The cathode C may be formed of a metal material having a low work function to smoothly supply electrons to the organic light emitting layer OL. The cathode C may be formed of a transparent conductive oxide such as indium tin oxide (ITO), indium zinc oxide (IZO), indium tin zinc oxide (ITZO), zinc oxide (ZnO), and tin oxide (TO) or an ytterbium (Yb) alloy. Alternatively, the cathode C may be formed of a metal material having a very thin thickness.

The organic light emitting layer OL is disposed between the anode A and the cathode C. The organic light emitting layer OL is a layer in which electrons and holes are coupled to emit light. At this time, the organic light emitting layer OL may be a white organic light emitting layer which emits white light.

In order to improve the luminous efficiency of the organic light emitting diode OLE, a hole injection layer, a hole transport layer, an electron transport layer, and an electron injection layer may be further included. For example, the hole injection layer and the hole transport layer may be disposed between the anode A and the organic light emitting layer OL and the electron transport layer and the electron injection layer may be disposed between the organic light emitting layer OL and the cathode C. Further, a hole blocking layer or an electron blocking layer may be disposed to further improve a recombination efficiency of the holes and electrons in the organic light emitting layer OL.

An encapsulation layer 115 is disposed on the organic light emitting diode OLE. The encapsulation layer 115 may be formed of an inorganic material. Referring to FIG. 3, even though the encapsulation layer 115 is illustrated as a single layer, the encapsulation layer 115 may include a plurality of encapsulation layers such as a first inorganic encapsulation layer, an organic encapsulation layer, and a second inorganic encapsulation layer.

A filler unit 116 is disposed on the encapsulation layer 115. The filler unit 116 occupies a space between the encapsulation layer 115 and the upper substrate 120.

The filler unit 116 may be an adhesive layer which adheres the encapsulation layer 115 and the upper substrate 120. At this time, the filler unit 116 may be a heat-curable, photo-curable, or natural curable adhesive. For example, the adhesive may be configured by a material such as a barrier pressure sensitive adhesive B-PSA.

Further, the filler unit 116 may be a moisture-proofing layer which reduces permeation of moisture and oxygen into the organic light emitting display device 100. When the lower substrate 110 and the upper substrate 120 are attached, if a separate material is not filled in a space between the lower substrate 110 and the upper substrate 120, the organic light emitting display device 100 may be relatively vulnerable to moisture and oxygen permeating from the outside. Therefore, the moisture-proofing layer which suppresses the permeation of moisture and oxygen is filled in the space between the lower substrate 110 and the upper substrate 120 to effectively block the moisture and oxygen permeating from the outside of the organic light emitting display device 100. At this time, the filler unit 116 may be formed of a moisture proof agent which absorbs moisture or suppresses the progress of moisture and oxygen.

A dam structure 180 is formed between the lower substrate 110 and the upper substrate 120 in the non-display area NDA. The dam structure 180 is disposed to enclose the filler unit 116 and is disposed to be in contact with the lower substrate 110 and the upper substrate 120. The dam structure 180 adheres between the lower substrate 110 and the upper substrate 120 to reinforce the adhesiveness of the filler unit 116 and blocks or at least reduces the permeation of moisture and oxygen from a side surface of the organic light emitting display device 100. The dam structure 180 serves as a member for sealing components between the lower substrate 110 and the upper substrate 120 so that it is also referred to as a sealant.

Hereinafter, the upper substrate 120 and components formed on the upper substrate 120 will be described with reference to FIG. 6. In FIG. 6, among the components of the organic light emitting display device 100, only the upper substrate 120 and the touch sensor 140, an upper touch pad unit PAD2 and a touch line 145 formed on the upper substrate 120 are illustrated.

The upper substrate 120 is disposed to be opposite to the lower substrate 110 to support various components of the organic light emitting display device 100. The upper substrate 120 is an encapsulation plate and protects the organic light emitting diode of the lower substrate 110 from moisture, air, or physical impacts entering from the outside. For example, the upper substrate 120 may be disposed by any one of glass, a metal foil, a plastic film, and the like.

Referring to FIG. 6, the upper substrate 120 is disposed to be opposite to a remaining area excluding the exposed area EA of the lower substrate 110. That is, the upper substrate 120 includes an area corresponding to the display area DA of the lower substrate 110 and an area corresponding to the non-display area NDA of the lower substrate 110. A size of the upper substrate 120 may be equal to a size of the area excluding the exposed area EA from the lower substrate 110.

Referring to FIG. 6, the black matrix BM and the color filter 130 are disposed on the upper substrate 120. The black matrix BM and the color filter 120 are formed on the same plane and are disposed on the upper substrate 120 to be in direct contact with the upper substrate 120.

The black matrix BM is disposed on the upper substrate 120. Further, the black matrix BM may be disposed so as to correspond to a position where a bank 114 disposed on the lower substrate 110 is formed. At this time, the black matrix BM is disposed between the color filters 130 to divide the color filters 131, 132, and 133. The black matrix BM suppresses the color mixture of light which passes through the color filters 131, 132, and 133 and defines a plurality of opening areas which allows light emitted from the organic light emitting diode OLE to be emitted to the outside.

The color filter 130 is disposed on the upper substrate 120 and is disposed on the same plane as the black matrix BM. The color filter 130 is formed in an area corresponding to the display area DA of the lower substrate 110. The color filter 130 may be formed in each sub-pixel SP and include a red color filter, a green color filter, and a blue color filter which are patterned for every sub-pixel SP.

A second buffer layer 121 is formed on the black matrix BM and the plurality of color filters 130. The second buffer layer 121 may protect or planarize the black matrix BM and the plurality of color filters 130. Specifically, the second buffer layer 121 suppresses the permeation of moisture or oxygen from the outside to protect the black matrix BM and the plurality of color filters 130. Further, the second buffer layer 121 may minimize the damage of the black matrix BM and the plurality of color filters 130 caused during the process of forming a touch electrode of the touch sensor 140 located thereabove.

The second buffer layer 121 may be formed of an inorganic material having an excellent barrier property. Therefore, the permeation of moisture or oxygen may be minimized. For example, the second buffer layer 121 may be formed of an inorganic material such as silicon nitride SiNx, silicon oxide SiOx, or aluminum oxide AlOx, but is not limited thereto.

Even though in FIG. 3, it is illustrated that the black matrix BM, the color filter 130, and the second buffer layer 121 are disposed on the upper substrate 120, they may be omitted depending on the structure or the characteristic of the organic light emitting display device 100.

The touch sensor 140 is disposed on the second buffer layer 121 to impart a touch sensing function to the organic light emitting display device 100. The touch sensor 140 is formed in an area corresponding to the display area DA of the lower substrate 110.

The touch sensor 140 includes a plurality of touch electrodes. The plurality of touch electrodes is electrodes which sense a touch input and is configured by a sensing electrode and a driving electrode and may detect a touch coordinate by sensing a change of the capacitance between the sensing electrode and the driving electrode. For example, the plurality of touch electrodes includes a first touch electrode 141, a second touch electrode 142, and a bridge electrode 143. The first touch electrodes 141 are disposed in a first direction to be connected to each other and the second touch electrodes 142 are disposed in a second direction different from the first direction to be connected to each other. The first touch electrode 141 and the second touch electrode 142 are disposed on the same second buffer layer 121 and are electrically insulated from each other. A touch insulating layer 122 is formed on the first touch electrode 141 and the second touch electrode 142. The bridge electrode 143 is disposed on the touch insulating layer 122. In order to suppress the short circuit of the first touch electrode 141 and the second touch electrode 142 at an intersection, adjacent first touch electrodes 141 may be electrically connected to each other by means of the bridge electrode 143. At this time, the bridge electrode 143 may intersect the second touch electrode 142. The placement of the touch electrode is not limited thereto and may vary if necessary.

The touch electrode may be formed of a transparent metal material which transmits the light, such as indium tin oxide (ITO) or indium zinc oxide (IZO). At this time, the first touch electrode 141 and the second touch electrode 142 may have various shapes such as a rectangular shape, an octagonal shape, a circular shape, or a rhombus shape.

Each of the first touch electrode 141 and the second touch electrode 142 is connected to the touch driver by means of the touch line 145. The touch line 145 transmits a touch driving pulse generated in the touch driver to the driving electrode and transmits a touch signal from the sensing electrode to the upper touch pad unit PAD2. The touch line 145 is disposed on the touch insulating layer 122 to connect the first touch electrode 141 and the second touch electrode 142 to the upper touch pad unit PAD2.

A touch protection layer 123 is disposed on the touch electrode and the touch line 145. The touch protection layer 123 suppresses the short-circuit or damage of the touch electrode and planarizes an upper surface of the touch electrode. The touch protection layer 123 may be formed of a transparent insulating resin such as an acrylic resin, a polyester resin, an epoxy resin, or a silicone resin.

Referring to FIG. 6, the upper touch pad unit PAD2 is formed on the upper substrate 120. The upper touch pad unit PAD2 is formed in a position corresponding to the lower touch pad unit PAD1. Referring to FIG. 2, when the upper substrate 120 and the lower substrate 110 are attached, the upper touch pad unit PAD2 is formed to overlap the lower touch pad unit PAD1. Even though in FIG. 6, for the convenience of description, six upper touch pad units PAD2 are provided, if the upper touch pad unit is disposed to overlap the lower touch pad unit, the shape, the number, etc. of upper touch pad units PAD2 are not limited to the exemplary embodiment illustrated in FIG. 6.

The upper touch pad unit PAD2 is electrically connected to the touch electrode of the touch sensor 140 by means of the touch line 145. Specifically, referring to FIG. 6, one upper touch pad unit PAD2 may be connected to the plurality of touch lines 145.

The upper touch pad unit PAD2 may be formed of a plurality of pad electrodes. In FIG. 6, referring to an area in which one upper touch pad unit PAD2 is enlarged, one upper touch pad unit PAD2 includes a plurality of upper touch pad electrodes 152. Each upper touch pad electrode 152 is electrically connected to each touch line 145. Even though in FIG. 6, for the convenience of description, the plurality of upper touch pad electrodes 152 is disposed in a zigzag pattern, the upper touch pad electrodes 152 may be disposed to extend in one direction or may form a matrix structure formed of a plurality of rows and columns.

Referring to FIG. 3, the upper touch pad electrode 152 which configures the upper touch pad unit PAD2 is in direct contact with the touch line 145. The upper touch pad electrode 152 may be formed of the same material as at least one of the touch electrode and the touch line 145 which configure the touch sensor 140 or a separate conductive material.

Referring to FIG. 3, a first connection electrode 161 is disposed on the lower touch pad electrode 151 which configures the lower touch pad unit PAD1 and a second connection electrode 162 is disposed on the upper touch pad electrode 152 which configures the upper touch pad unit PAD2. The first connection electrode 161 is disposed to be in direct contact with the lower touch pad electrode 151 and the second connection electrode 162 is disposed to be in direct contact with the upper touch pad electrode 152.

For example, referring to an enlarged area of FIG. 6, each of the plurality of second connection electrodes 162 is disposed on each of the upper touch pad electrodes 152. In FIG. 6, even though a structure in which a width of the second connection electrode 162 is smaller than a width of the upper touch pad electrode 152 is illustrated, the width of the second connection electrode 162 may be larger than the width of the upper touch pad electrode 152. In this case, the second connection electrode 162 may be formed to cover an exposed side surface of the upper touch pad electrode 152 and a contact area with a self-assembly contact member 170 (shown in FIGS. 3 and 4) to be described below may be increased. When the area of the second connection electrode 162 is increased, the self-assembly contact member 170 may be more easily assembled in the second connection electrode 162. This may be applied to the first connection electrode 161 and the lower touch pad electrode 151 in the same manner.

The first connection electrode 161 and the second connection electrode 162 may be formed of a metal material including any one of copper (Cu), silver (Ag), gold (Au), and aluminum (Al) or an alloy of two or more of them, but are not limited thereto. If necessary, the first connection electrode 161 and the second connection electrode 162 may be selectively formed of other conductive materials.

The first connection electrode 161 and the second connection electrode 162 may be disposed to be opposite to each other with a predetermined interval therebetween. Further, the first connection electrode 161 and the second connection electrode 162 have a predetermined height d1 or higher. By doing this, the first connection electrode 161 and the second connection electrode 162 compensate for the problem in that it is difficult to electrically connect the upper touch pad electrode 152 and the lower touch pad electrode 151 due to the interval between the upper substrate 120 and the lower substrate 110. In the meantime, a specific shape of the first connection electrode 161 and the second connection electrode 162 will be described below together with the self-assembly contact member 170.

The self-assembly contact member 170 is formed between the first connection electrode 161 and the second connection electrode 162. The self-assembly contact member 170 is disposed to be in contact with the first connection electrode 161 and the second connection electrode 162 to electrically connect the lower touch pad electrode 151 and the upper touch pad electrode 152. Without performing a separate alignment process of the self-assembly contact member 170, components in the self-assembly contact member 170 may implement an electrical contact between the first connection electrode 161 and the second connection electrode 162 by the self-assembly.

The self-assembly contact member 170 includes solder particles SR. The solder particles SR are melted by heat or UV and then assembled between the first connection electrode 161 and the second connection electrode 162 to electrically connect the first connection electrode 161 and the second connection electrode 162.

The solder particles SR may be metal particles having a low melting point. The solder particles SR may be metal particles which are melted at a temperature of 120° C. to 200° C. to be easily melted, but are not limited thereto.

The solder particles SR may be alloy particles formed of two or more materials selected from a group consisting of silver, copper, lead, bismuth, zinc, tin, and indium. To be more specific, the solder particles SR may be particles of a tin alloy formed by an alloy of at least one of copper, bismuth, zinc, indium, or tin. Further, the solder particles SR may be particles of an indium alloy formed by an alloy of at least one of silver, copper, bismuth, zinc, tin, or indium. For example, the solder particles SR may be at least one selected from a group consisting of a tin-silver alloy, a tin-copper alloy, a tin-silver-copper alloy, a tin-bismuth alloy, a tin-zinc alloy, a tin-lead alloy, a tin-lead-silver alloy, a tin-bismuth-silver alloy, and a tin-indium alloy.

The solder particles SR may have a spherical or elliptical shape before being melted. An average diameter of the solder particles SR may be 2 μm to 10 μm, but is not limited thereto. When the average diameter of the solder particles SR is equal to or larger than 2 μm, a self-assembly characteristic required for a manufacturing process is satisfied. Further, when the average diameter of the solder particles SR is equal to or smaller than 10 μm, the short between wiring lines is not caused and the electrical contact reliability of the wiring line having a minute pitch may be ensured.

Further, the average diameter of the solder particles SR may be similar to an interval d2 between the first connection electrode 161 and the second connection electrode 162. When the average diameter of the solder particles SR is substantially equal to the interval d2 between the first connection electrode 161 and the second connection electrode 162, the electrical contact reliability between the first connection electrode 161 and the second connection electrode 162 may be ensured.

Further, the average diameter of the solder particle SR may be larger than ½ of the height d1 of the first connection electrode 161 and may be equal to the height d1 of the first connection electrode 161. For example, when the height of the first connection electrode 161 is 7 μm, the average diameter of the solder particles SR may be 4 μm to 9 μm. When the average diameter of the solder particles SR is significantly smaller than the height d1 of the first connection electrode 161, it may be difficult for the self-assembly contact member 170 formed by melting the solder particles SR to connect the first connection electrode 161 and the second connection electrode 162. Further, when the average diameter of the solder particles SR is significantly larger than the height d1 of the first connection electrode 161, a short may be generated between adjacent electrodes, that is, between the adjacent first connection electrodes 161.

The self-assembly contact member 170 may further include a polymer resin. The polymer resin may be formed of an adhesive having an adhering property. The polymer resin may physically fix the first connection electrode 161 and the second connection electrode 162. For example, the polymer resin may be an acrylic resin, a methacrylic resin, a polyisoprene, a vinyl resin, an epoxy resin, a urethane resin, a cellulose resin, a polyester resin, or a combination thereof, but is not limited thereto.

The self-assembly contact member 170 is formed during a process of melting the solder particles SR with heat to have an atypical shape. Referring to FIGS. 3 and 4, the self-assembly contact member 170 formed in the first connection electrode 161 and the second connection electrode 162 may have an amorphous shape and may be formed in a random pattern.

In the organic light emitting display device, the thin film transistor and the organic light emitting diode are disposed on the lower substrate which is used as a base substrate and the touch sensor is formed on the upper substrate which is used as an encapsulation plate. In such an organic light emitting display device, a printed circuit board which transmits a driving signal to the thin film transistor of the lower substrate and a printed circuit board which transmits a sensing signal to the touch sensor of the upper substrate are individually configured to be separately connected to the lower substrate and the upper substrate. In this case, the printed circuit boards need to be attached to the lower substrate and the upper substrate, respectively, and the number of the printed circuit boards is increased so that the cost for components is increased and there are a lot of restrictions in the design of the organic light emitting display device.

In order to solve this problem, an upper pad unit and a lower pad unit which are connected to the touch sensor are formed on the upper substrate and the lower substrate, respectively, and the upper pad unit formed on the upper substrate is electrically connected to the lower pad unit formed on the lower substrate. By doing this, signals may be transmitted from the printed circuit board disposed on the lower substrate to the touch sensor disposed on the upper substrate.

However, the lower substrate 110 on which the thin film transistor TFT and the organic light emitting diode OLE are disposed is spaced apart from the upper substrate 120 on which the touch sensor 140 is disposed, with a predetermined interval or more. For example, the distance between the lower substrate 110 and the upper substrate 120 may be 10 μm to 100 μm. In this case, when a conductive adhesive film such as an anisotropic conductive film (ACF) is used for an electric contact between the pad units according to the related art, it is difficult to electrically connect the pad unit of the lower substrate and the pad unit of the upper substrate.

Therefore, in the organic light emitting display device 100 according to the exemplary embodiment of the present disclosure, the connection electrodes 161 and 162 and the self-assembly contact member 170 are formed between the lower touch pad unit PAD1 formed on the lower substrate 110 and the upper touch pad unit PAD2 formed on the upper substrate 120. By doing this, the lower touch pad unit PAD1 and the upper touch pad unit PAD2 are electrically connected.

At this time, the first touch electrode 161 and the second touch electrode 162 may have various shapes such as a rectangular shape, an octagonal shape, a circular shape, or a rhombus shape in plan view. The first connection electrode 161 and the second connection electrode 162 may have planar shapes. The planar first connection electrode 161 and second connection electrode 162 have a larger area than that of the lower touch pad 152 and the upper touch pad 153 and thus, the solder particles SR may be easily assembled. The first connection electrode 161 and the second connection electrode 162 may have a pillar shape with a flat upper surface or a pyramid shape with a cut upper portion. The first connection electrode 161 and the second connection electrode 162 having a pillar shape or a pyramid shape with a cut upper portion may reduce the interval d2 between the lower touch pad electrode 152 and the upper touch pad electrode 153. At this time, the flat surfaces are formed on the first connection electrode 161 and the second connection electrode 162 so that the solder particles SR may be more easily assembled on the top surfaces of the first connection electrode 161 and the second connection electrode 162.

Specifically, referring to FIGS. 3 and 4, the distance d3 between the lower substrate 110 and the upper substrate 120 may be in a range of 10 μm to 50 μm. At this time, the heights d1 of the first connection electrode 161 and the second connection electrode 162 may be in a range of 0.1 μm to 8 μm. When the first connection electrode 161 and the second connection electrode 162 have a planar shape, the first connection electrode 161 and the second connection electrode 162 may be formed to be thin with a thickness of 0.1 μm. The first connection electrode 161 and the second connection electrode 162 having a planar shape may help the solder particles SR to be easily assembled on the pad unit. When the heights d1 of the first connection electrode 161 and the second connection electrode 162 are greater than 8 μm, it is difficult for the solder particles SR to be assembled on the top surface of the first connection electrode 161. That is, the self-assembly contact member 170 is hardly formed between the first connection electrode 161 and the second connection electrode 162, so that it is difficult to electrically connect the lower touch pad and the upper touch pad.

The interval d2 of the first connection electrode 161 and the second connection electrode 162 may be in a range of 1 μm to 40 μm. When the interval d2 of the first connection electrode 161 and the second connection electrode 162 is less than 1 μm, it is difficult to self-assemble the solder particles SR or a short with an adjacent electrode may be caused. When the interval d2 between the first connection electrode 161 and the second connection electrode 162 is greater than 40 μm, it is difficult for the self-assembly contact member 170 formed by melting the solder particles SR to connect the first connection electrode 161 and the second connection electrode 162.

In the organic light emitting display device 100 according to the exemplary embodiment of the present disclosure, the connection electrodes and the self-assembly contact member 170 are formed between the upper touch pad unit PAD2 and the lower touch pad unit PAD1. The upper touch pad unit PAD2 is formed on the upper substrate 120 on which the touch sensor 140 is disposed and the lower touch pad unit PAD1 is formed on the lower substrate 110. By doing this, the lower touch pad unit PAD1 and the upper touch pad unit PAD2 having a predetermined interval or more may be electrically connected. By doing this, the signal may be simultaneously transmitted to the thin film transistor TFT disposed on the lower substrate 110 and the touch sensor 140 disposed on the upper substrate 120 only by means of the printed circuit board PCB disposed on the lower substrate 110. Therefore, the number of printed circuit boards PCB is reduced so that the cost for components of the organic light emitting display device 100 may be reduced and degrees of freedom of the design of the organic light emitting display device 100 and the placement of the components may be improved.

Hereinafter, a manufacturing method of an organic light emitting display device according to an exemplary embodiment of the present disclosure will be described with reference to FIGS. 7 and 8A to 8C.

Figure 7:
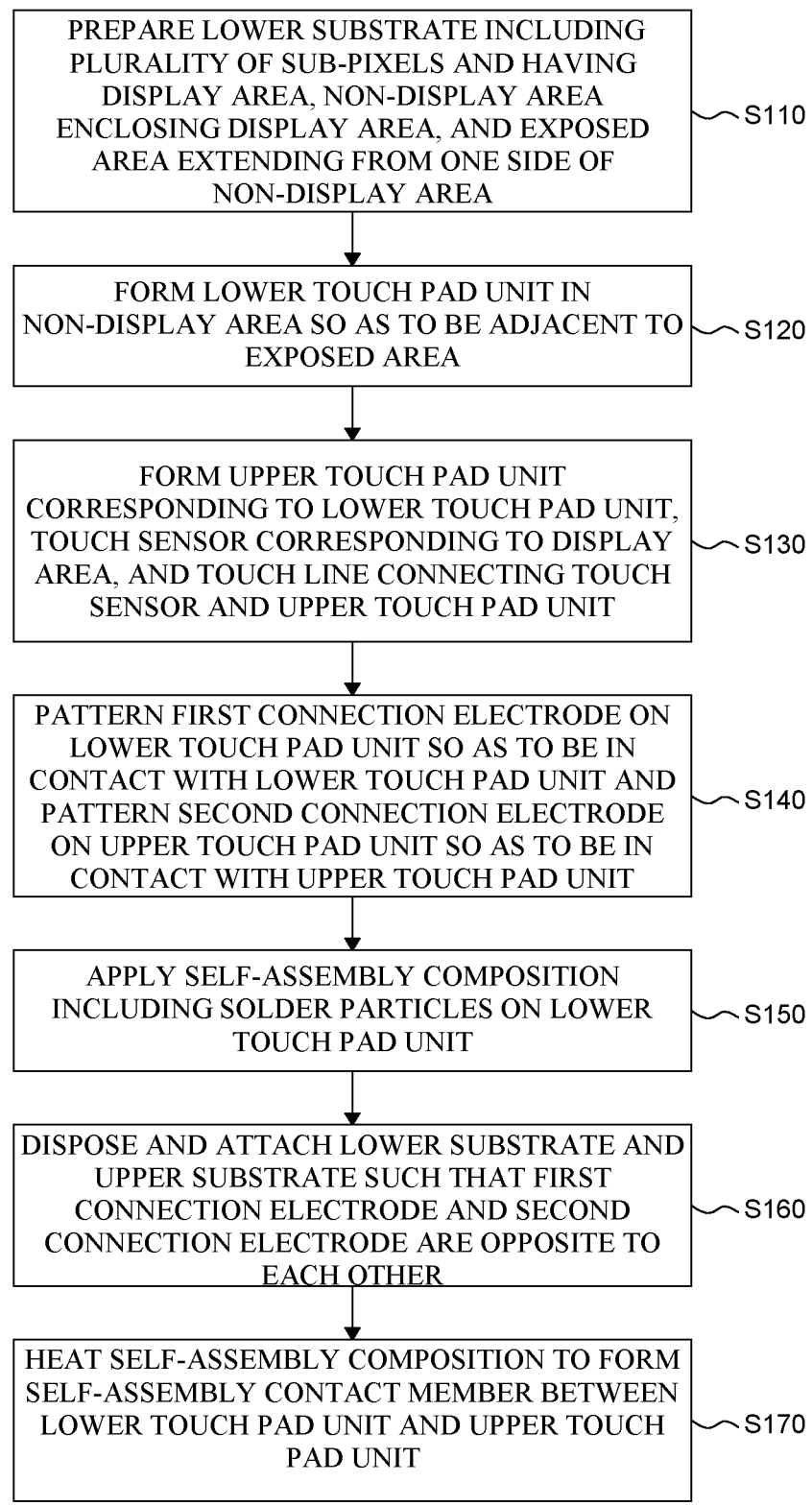
FIG. 7 is a flowchart for explaining a manufacturing method of an organic light emitting display device according to an exemplary embodiment of the present disclosure.
Figure 8A:
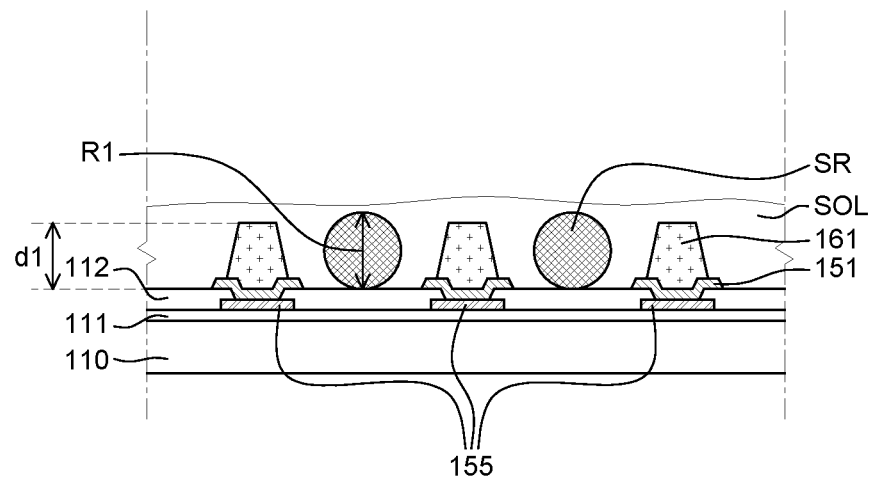
FIGS. 8A to 8C are cross-sectional process diagrams for explaining a manufacturing method of an organic light emitting display device according to an exemplary embodiment of the present disclosure.
Figure 8B:
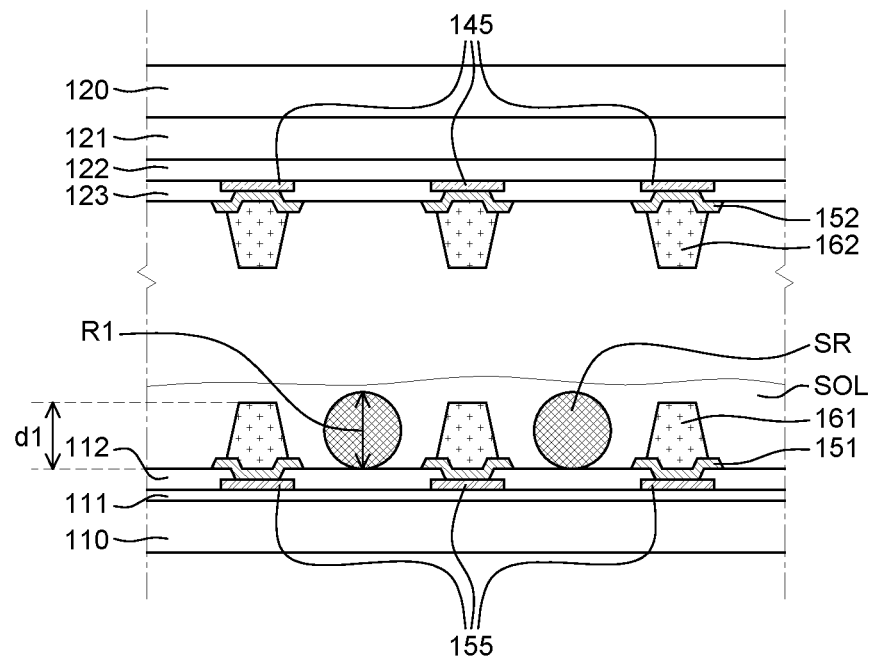
Figure 8C:
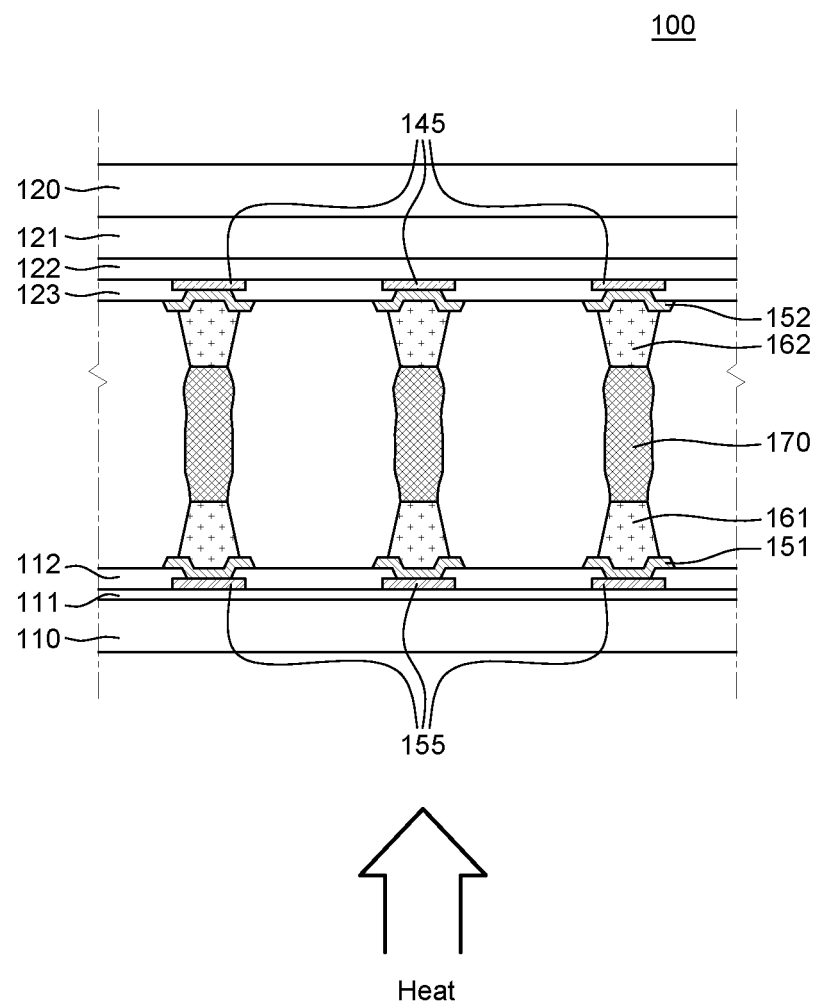

FIG. 7 is a flowchart for explaining a manufacturing method of an organic light emitting display device according to an exemplary embodiment of the present disclosure. FIGS. 8A to 8C are cross-sectional process diagrams for explaining a manufacturing method of an organic light emitting display device according to an exemplary embodiment of the present disclosure. The cross-sectional process diagrams illustrated in FIGS. 8A to 8C are cross-sectional process diagrams of an area illustrated in FIG. 4 in which the lower touch pad unit PAD1 and the upper touch pad unit PAD2 overlap. Therefore, a redundant description for components which have been described with reference to FIG. 4 will be omitted. The manufacturing method of the organic light emitting display device according to the exemplary embodiment of the present disclosure will be described also with reference to the above-described components illustrated in FIGS. 1 to 6 so that the description of the repeated components will be omitted.

First, a lower substrate 110 which includes a plurality of sub-pixels SP and has a display area DA, a non-display area NDA which encloses the display area DA, and an exposed area EA extending from one side of the non-display area NDA is prepared (S110).

The lower substrate 110 may be formed from a lower mother glass substrate. In the lower mother glass substrate, a panel area including a display area DA, a non-display area NDA which encloses the display area DA, and an exposed area EA extending from one side of the non-display area NDA may be defined. The lower substrate 110 may be formed for every panel area by cutting the lower mother glass substrate.

Thereafter, a thin film transistor TFT, an organic light emitting diode OLE, and an encapsulation layer 115 are sequentially formed on the lower substrate 110.

Next, a lower touch pad unit PAD1 is formed in the non-display area NDA to be adjacent to the exposed area EA (S120).

The lower touch pad unit PAD1 is formed in the non-display area NDA of the lower substrate 110. Specifically, the lower touch pad unit PAD1 is formed between the display area DA and the exposed area EA to be adjacent to the exposed area EA. Specifically, a plurality of lower touch pad electrodes 151 is formed in the non-display area NDA of the lower substrate 110. The lower touch pad electrode 151 may be formed of the same material as one of various conductive materials which configure the thin film transistor TFT and the organic light emitting diode OLE formed in the display area DA. The lower touch pad electrode 151 is in contact with the connection line 155 located therebelow, through a contact hole formed in an insulating layer disposed therebelow.

In the meantime, the connection pad unit PAD3 may be formed simultaneously, before, or after a process of forming the lower touch pad unit PAD1. The connection pad unit PAD3 is formed in the exposed area EA. Specifically, a plurality of connection pad electrodes 153 are formed in the exposed area EA of the lower substrate 110. The connection pad electrode 153 may be formed of the same material as the lower touch pad electrode 151. The connection pad electrode 153 is in contact with the connection line 155 located therebelow, through a contact hole formed in an insulating layer disposed therebelow. By doing this, the lower touch pad electrode 151 and the connection pad electrode 153 are electrically connected to each other.

Next, the upper touch pad unit PAD2 corresponding to the lower touch pad unit PAD1, the touch sensor 140 corresponding to the display area DA, and the touch line 145 which connects the touch sensor 140 and the upper touch pad unit PAD2 are formed on the upper substrate 120 (S130).

The touch sensor 140 including the plurality of first touch electrodes 141 and second touch electrodes 142 is formed on the upper substrate 120 corresponding to the display area DA of the lower substrate 110. Specifically, the second buffer layer 121, the first touch electrode 141, the second touch electrode 142, the touch insulating layer 122, the bridge electrode 143, and the touch protection layer 123 may be sequentially laminated on the upper substrate 120.

In the meantime, the touch sensor 140 and the touch line 145 which connects the touch sensor 140 and the upper touch pad unit PAD2 are simultaneously formed. The touch line 145 extends from one side of the first touch electrode 141 and the second touch electrode 142 to be formed along the non-display area NDA. The touch line 145 may be formed of the same material as the first touch electrode 141 and the second touch electrode 42 which configure the touch sensor 140.

The upper touch pad unit PAD2 is formed on the upper substrate 120 so as to overlap the lower touch pad unit PAD1 of the lower substrate 110. Specifically, the plurality of upper touch pad electrodes 152 are formed on the touch protection layer 123 so as to respectively overlap the plurality of lower touch pad electrodes 151 which configures the lower touch pad unit PAD1. At this time, the lower touch pad electrode 151 is in contact with the touch line 145 located therebelow, through a contact hole formed in the touch protection layer 123.

In the meantime, a step of forming the black matrix BM and the color filter 130 on the upper substrate 120 may be further included. For example, the touch sensor 140 may be formed after forming the black matrix BM and the color filter 130 on the upper substrate 120. Further, as described above, after forming the touch sensor 140 on the upper substrate 120, the black matrix BM and the color filter 130 may be formed on the touch protection layer 123.

Next, the first connection electrode 161 is patterned on the lower touch pad unit PAD1 to be in contact with the lower touch pad unit PAD1 and the second connection electrode 162 is patterned on the upper touch pad unit PAD2 to be in contact with the upper touch pad unit PAD2 (S140).

The plurality of first connection electrodes 161 is formed on the lower touch pad electrode 151 so as to be in contact with the plurality of lower touch pad electrodes 151 which configures the lower touch pad unit PAD1. Similarly, the plurality of second connection electrodes 162 is formed on the upper touch pad electrode 152 so as to be in contact with the plurality of upper touch pad electrodes 152 which configures the upper touch pad unit PAD2.

The first connection electrode 161 and the second connection electrode 162 are patterned so as to correspond to the pad electrodes, but the patterning method is not limited. Further, the first connection electrode 161 and the second connection electrode 162 have a predetermined height or higher. For example, the first connection electrode 161 and the second connection electrode 162 may be patterned to have a height d1 of 2 μm to 8 μm.

A self-assembly composition SOL including the solder particles SR is applied on the lower touch pad unit PAD1 (S150).

Referring to FIG. 8A, the self-assembly composition SOL includes solder particles SR and a solvent. The solder particles SR may be metal particles having a low melting point. An average diameter R1 of the solder particles SR may be in a range of 2 μm to 10 μm and may be similar to the height d1 of the first connection electrode 161. When the average diameter R1 of the solder particles SR may be similar to the height d1 of the first connection electrode 161, the top surface of the first connection electrode 161 may be easily assembled during the process of melting the solder particles SR.

The self-assembly composition SOL may further include a polymer resin to add an adhesive ability. The polymer resin may be formed of an adhesive having an adhering property. The polymer resin composition may be a heat curable composition and a UV curable composition.

The self-assembly composition SOL may be applied on the lower touch pad unit PAD1 using a dispensing method, a coating method, a dotting method, a screen printing method, a slit-coating method, but is not limited thereto.

The lower substrate 110 and the upper substrate 120 are disposed and attached such that the first connection electrode 161 and the second connection electrode 162 are opposite to each other (S160).

First, a dam structure 180 is formed in the non-display area NDA of the lower substrate 110 so as to enclose the display area DA. The dam structure 180 may be formed of a sealant material which is capable of performing a sealing function. The adhesive is filled in the dam structure 180 so as to correspond to the display area DA. The adhesive adheres the lower substrate 110 and the upper substrate 120. The adhesive may be a photo-curable or a natural curable adhesive, and for example, may be formed of a material such as a barrier pressure sensitive adhesive (B-PSA).

Referring to FIG. 8B, the upper substrate 120 is disposed on the lower substrate 110 such that the display area DA of the lower substrate 110 corresponds to the touch sensor 140 of the upper substrate 120 and the lower sensor pad unit corresponds to the upper sensor pad unit. Thereafter, the lower substrate 110 and the upper substrate 120 are attached by applying a pressure. At this time, the lower substrate 110 and the upper substrate 120 are disposed with a predetermined interval such that the first connection electrode 161 and the second connection electrode 162 which are opposite to each other are spaced apart from each other.

The self-assembly composition SOL is heated to form a self-assembly contact member 170 between the lower touch pad unit PAD1 and the upper touch pad unit PAD2 (S170).

The self-assembly composition SOL disposed in the lower touch pad unit PAD1 is heated to melt the solder particles SR. For example, the self-assembly composition SOL is heated by directly applying heat or irradiating UV onto the lower touch pad unit PAD1. Further, the self-assembly composition SOL disposed between the lower touch pad unit PAD1 and the upper touch pad unit PAD2 is heated using a magnetic field induction heating device. The magnetic field induction heating device applies an AC magnetic field to the self-assembly composition SOL and at this time, the induced heat is supplied to the self-assembly composition SOL by the AC magnetic field.

Referring to FIG. 8C, when a heat higher than a melting point of the solder particles SR is applied, the solder particles SR are melted. The melted solder particles are assembled while being in contact with the first connection electrode 161 and the second connection electrode 162 to electrically connect the first connection electrode 161 and the second connection electrode 162. That is, the melted solder particles SR form a metal material, such as an auxiliary electrode, between the first connection electrode 161 and the second connection electrode 162 to be in direct contact with the first connection electrode 161 and the second connection electrode 162. Further, the melted solder particles electrically connect the lower touch pad unit PAD1 and the upper touch pad unit PAD2.

In the meantime, the self-assembly composition SOL is heated and the lower substrate 110 and the upper substrate 120 are entirely heated. The display areas DA of the lower substrate 110 and the upper substrate 120 are heated so that the adhesive filled in the dam structure 180 is hardened to adhere the lower substrate 110 and the upper substrate 120 and form the filler unit 116.

According to the manufacturing method of the organic light emitting display device 100 according to the exemplary embodiment of the present disclosure, the connection electrode having a predetermined thickness or larger and the self-assembly contact member 170 formed from the self-assembly composition SOL including the solder particles SR are formed between the lower touch pad unit PAD1 disposed on the lower substrate 110 and the upper touch pad unit PAD2 disposed on the upper substrate 120. By doing this, the lower touch pad unit PAD1 and the upper touch pad unit PAD2 having a predetermined interval or larger are electrically connected. By doing this, separate printed circuit boards PCB are not disposed on the upper substrate 120 on which the touch sensor 140 is disposed and the lower substrate 110 on which the thin film transistor TFT is disposed. Instead, signals may be simultaneously transmitted to the thin film transistor TFT disposed on the lower substrate 110 and the touch sensor 140 disposed on the upper substrate 120, only by means of the printed circuit board PCB disposed on the lower substrate 110. By doing this, the number of printed circuit boards PCB is reduced and the degrees of freedom of design and placement of the organic light emitting display device 100 may be improved.

Figure 9:
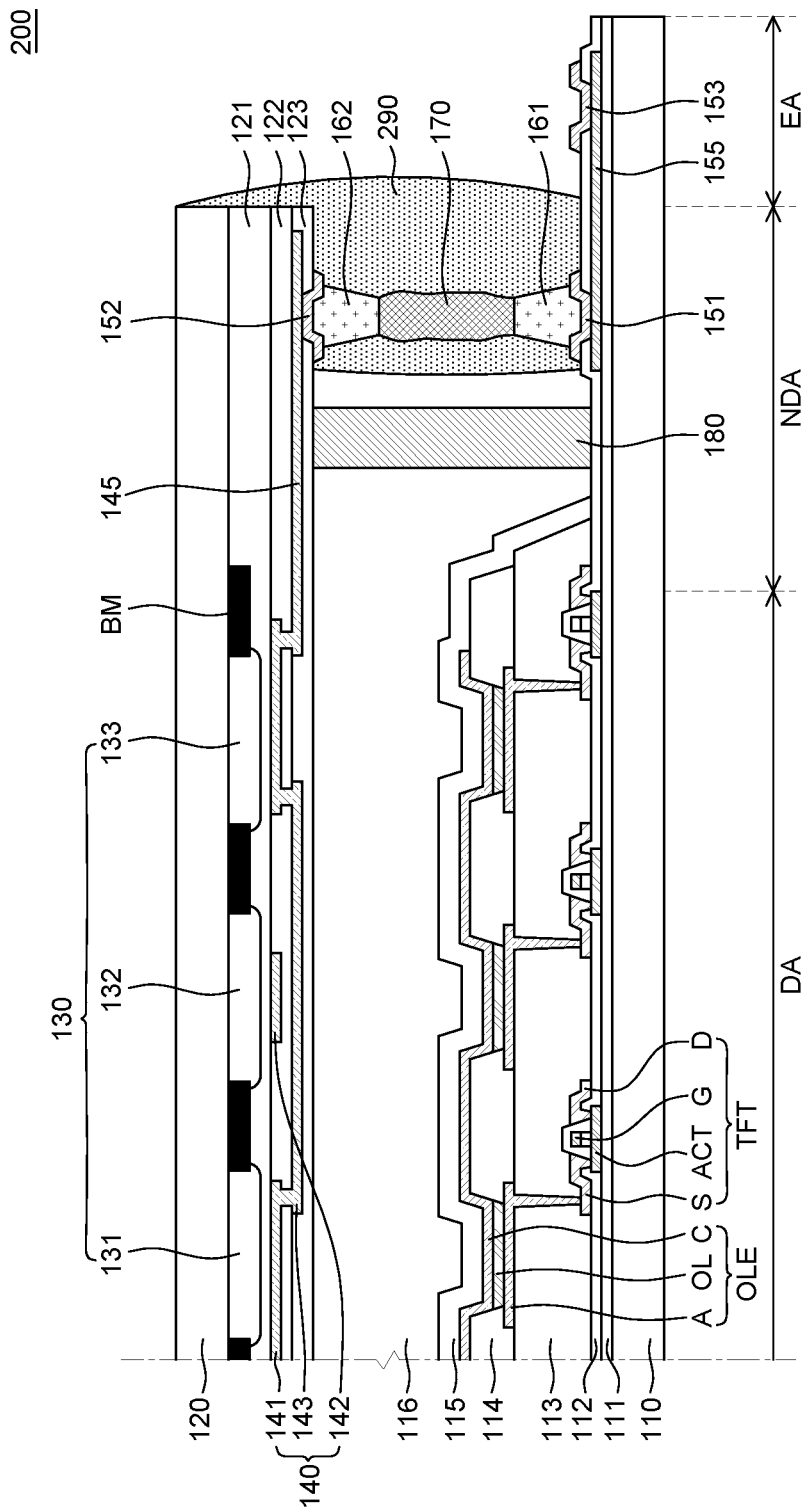
FIGS. 9 and 10 are schematic cross-sectional views of an organic light emitting display device according to another exemplary embodiment of the present disclosure.
Figure 10:
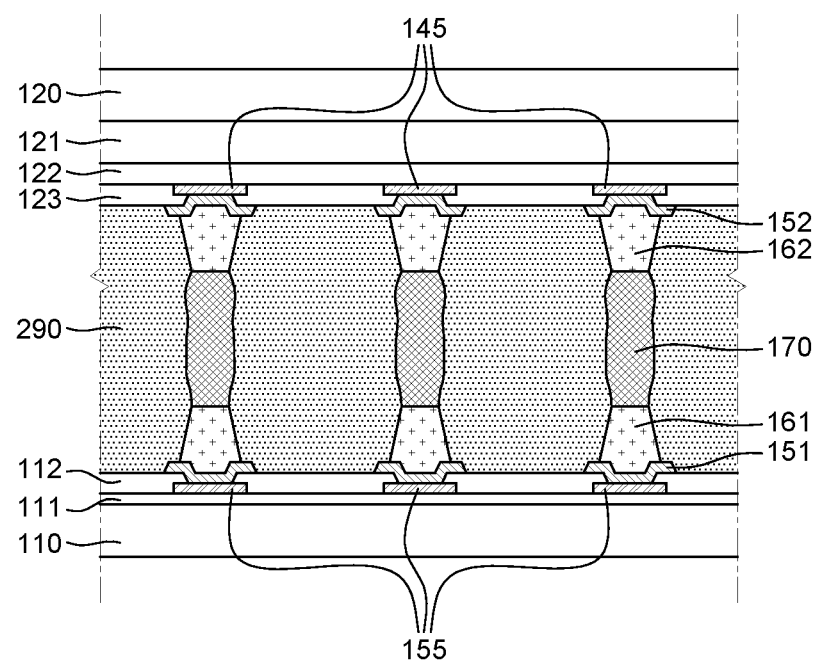

FIGS. 9 and 10 are schematic cross-sectional views of an organic light emitting display device according to another exemplary embodiment of the present disclosure.

Components of the organic light emitting display device 200 illustrated in FIGS. 9 and 10 are substantially the same as those of the organic light emitting display device 100 illustrated in FIGS. 1 to 6 except that a sealing member 290 is further included. Therefore, a redundant description will be omitted.

Referring to FIGS. 9 and 10, a sealing member 290 is disposed so as to enclose a first connection electrode 161, a second connection electrode 162, and a self-assembly contact member 170 which are disposed in the non-display area NDA. As illustrated in FIG. 9, the sealing member 290 is formed to cover all side surfaces of the first connection electrode 161, the self-assembly contact member 170, and the second connection line 162 which are laminated to electrically connect the lower touch pad electrode 151 of the lower substrate 110 and the upper touch pad electrode 152 of the upper substrate 120.

Specifically, the first connection electrode 161, the self-assembly contact member 170, and the second connection electrode 162 are laminated between the lower touch pad electrode 151 and the upper touch pad electrode 152 which are opposite to each other to form a pillar-shaped electrode. A plurality of pillar-shaped electrodes are configured to connect the plurality of lower touch pad electrodes 151 and the plurality of upper touch pad electrodes 152 included in the lower touch pad and the upper touch pad which are opposite to each other. At this time, the sealing member 290 is disposed to be in contact with the pillar-shaped electrodes to cover all the side surfaces of the pillar-shaped electrodes.

Referring to FIG. 10, the sealing member 290 may be disposed to be fully filled between the pillar-shaped electrodes which are adjacent to each other. However, the structure of the sealing member 290 is not limited to the exemplary embodiment illustrated in FIG. 10. For example, the sealing member may be disposed to enclose the side surface of the pillar-shaped electrode to maintain the pillar shape without being fully filled between the pillar-shaped electrodes which are adjacent to each other.

The sealing member 290 supplements the rigidity of the first connection electrode 161, the self-assembly contact member 170, and the second connection electrode 162 and suppresses the impact from the outside and the cracks. Widths of the first connection electrode 161, the self-assembly contact member 170, and the second connection electrode 162 which connect between the lower touch pad unit PAD1 and the upper touch pad unit PAD2 are small so that cracks may be caused by the external impact. Therefore, the sealing member 290 protects the pillar-shaped electrode formed by laminating the first connection electrode 161, the self-assembly contact member 170, and the second connection electrode 162 and increases the rigidity.

Referring to FIG. 9, the sealing member 290 may extend to cover at least a part of the side surface of the upper substrate 120 corresponding to the non-display area NDA adjacent to the exposed area EA. In this case, the sealing member may completely seal between the lower touch pad unit PAD1 and the upper touch pad unit PAD2 so that permeation of the moisture and oxygen into the pad unit may be reduced.

The sealing member 290 may be formed of a sealant material which seals the pillar-shaped electrode formed by laminating the first connection electrode 161, the self-assembly contact member 170, and the second connection electrode 162. For example, the sealing member 290 may be formed of an adhesive or a curable resin composition. For example, the sealing member 290 may be formed of an epoxy resin, an acrylic resin, and a urethane resin, but is not limited thereto.

Hereinafter, a manufacturing method of an organic light emitting display device according to another exemplary embodiment of the present disclosure will be described with reference to FIGS. 11A to 11D.

FIGS. 11A to 11D are cross-sectional process diagrams for explaining a manufacturing method of an organic light emitting display device 100 according to another exemplary embodiment of the present disclosure. The cross-sectional process diagrams illustrated in FIGS. 11A to 11D are the cross-sectional process diagrams of the organic light emitting display device 200 according to another exemplary embodiment of the present disclosure illustrated in FIG. 9. Therefore, a redundant description for components which have been described with reference to FIG. 9 will be omitted.

In the meantime, as compared with the manufacturing method of the organic light emitting display device 100 of FIG. 7, the manufacturing method of the organic light emitting display device 200 according to another exemplary embodiment of the present disclosure may further include a step of further forming a sealing member 290. Accordingly, the manufacturing method of the organic light emitting display device 200 according to another exemplary embodiment of the present disclosure includes the steps S110 to S170 of FIG. 7 as it is. Therefore, a redundant description of the steps S110 to S170 of FIG. 7 which have been described above will be omitted.

Figure 11A:
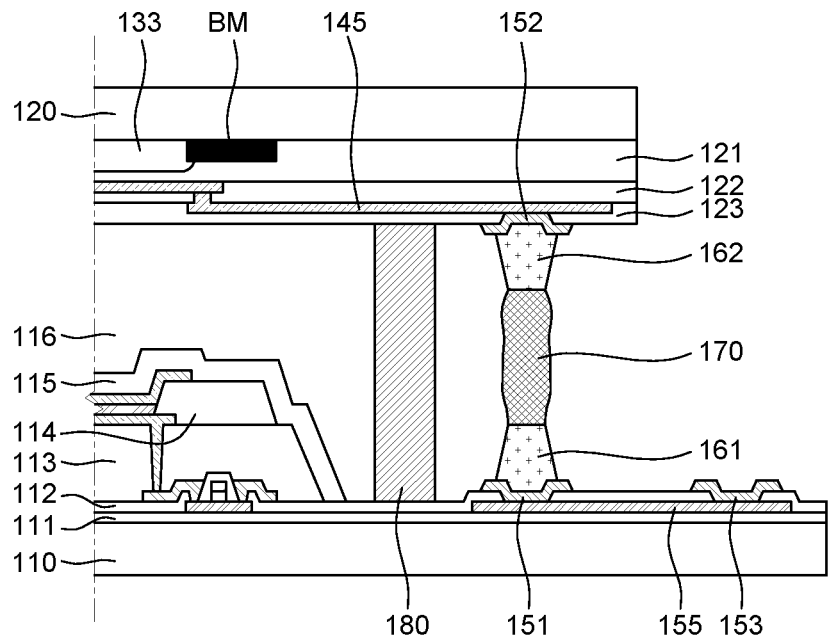
FIGS. 11A to 11D are cross-sectional process diagrams for explaining a manufacturing method of an organic light emitting display device according to another exemplary embodiment of the present disclosure.

Referring to FIG. 11A, by the method of manufacturing the organic light emitting display device 100 illustrated in FIG. 7, an organic light emitting display device in which the first connection electrode 161, the self-assembly contact member 170, and the second connection electrode 162 are disposed between the lower touch pad electrode 151 of the lower substrate 110 and the upper touch pad electrode 152 of the upper substrate 120 disposed in the non-display area NDA is manufactured.

Figure 11B:
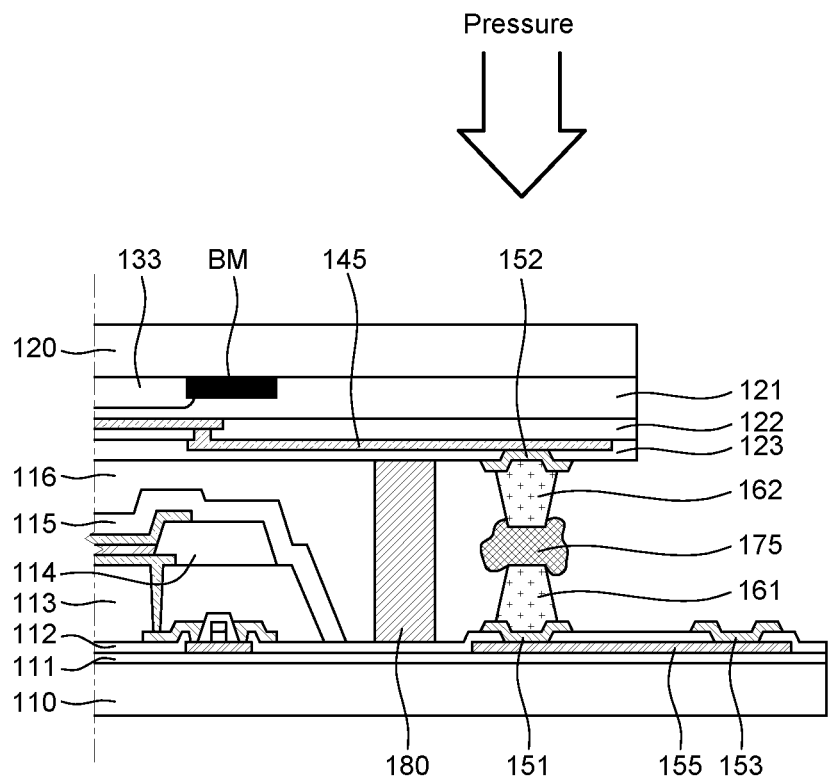

Referring to FIG. 11B, the pressure is applied from the upper substrate 120 to the lower substrate 110. The interval between the upper substrate 120 and the lower substrate 110 is reduced by the applied pressure. At this time, the self-assembly contact member 175 disposed between the first connection electrode 161 and the second connection electrode 162 may be deformed, but is not limited thereto. That is, the first connection electrode 161 and the second connection electrode 162 may also be deformed together with the self-assembly contact member 175.

Figure 11C:
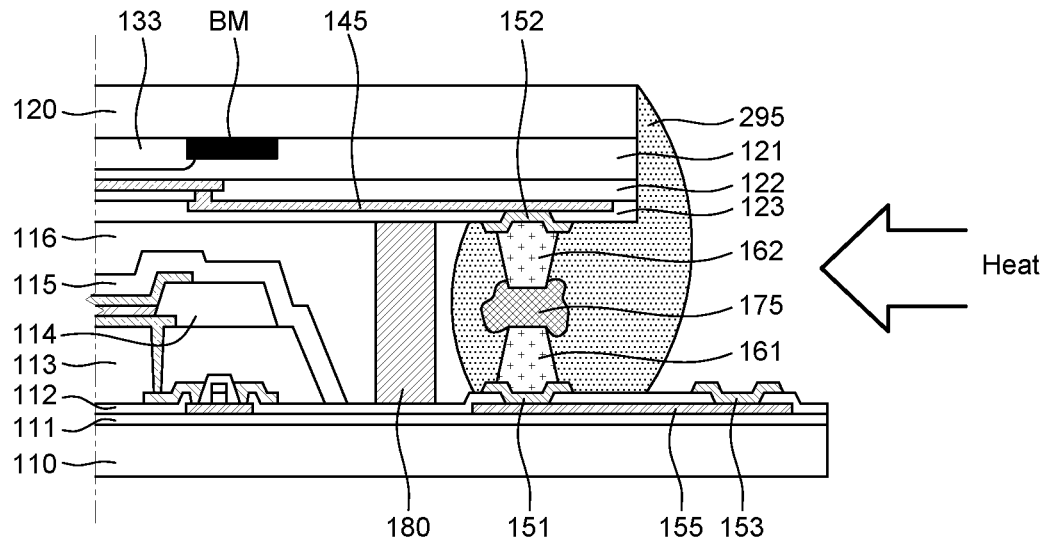

Next, referring to FIG. 11C, a sealing composition 295 is applied in the non-display area so as to be in contact with all the side surfaces of the first connection electrode 161, the self-assembly contact member 175, and the second connection electrode 162 while maintaining the pressure. At this time, the sealing composition 295 is applied so as to cover at least a part of a side surface of the upper substrate 120 corresponding to the non-display area NDA adjacent to the exposed area EA.

Next, the sealing composition 295 which is applied to cover the side surfaces of the first connection electrode 161, the self-assembly contact member, and the second connection electrode 162 is hardened. The sealing composition 295 may be hardened by applying heat, irradiating UV, or being exposed to a wet environment, depending on the type.

Figure 11D:
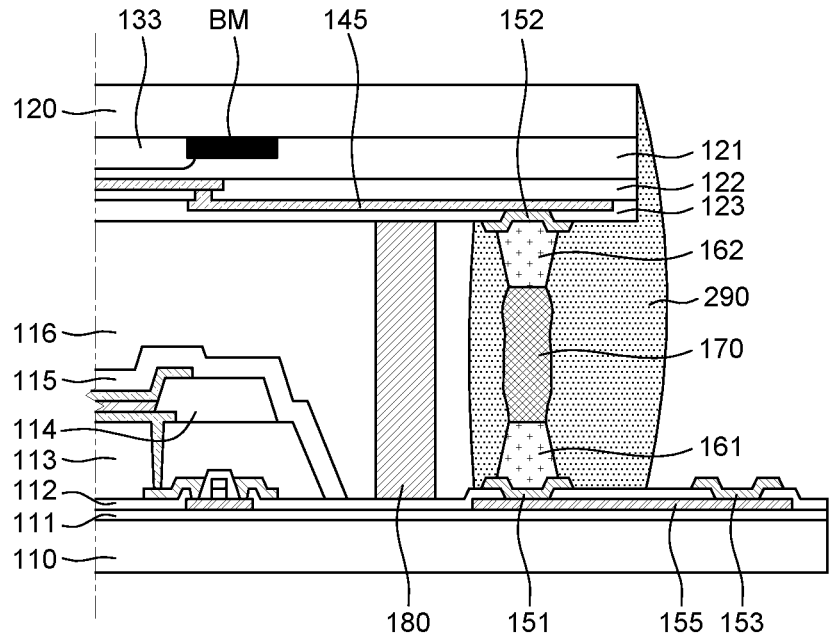

Next, referring to FIG. 11D, the pressure which is applied to the upper substrate 120 is removed to form the sealing member 290 which covers the side surfaces of the first connection electrode 161, the self-assembly contact member 170, and the second connection electrode 162.

The exemplary embodiments of the present disclosure can also be described as follows:

According to an aspect of the present disclosure, there is provided an organic light emitting display device. The organic light emitting display device comprises a lower substrate including a plurality of sub-pixels and having a display area, a non-display area enclosing the display area, and an exposed area extending from one side of the non-display area, a lower touch pad unit formed in the non-display area so as to be adjacent to the exposed area on the lower substrate, an upper substrate disposed so as to be opposite to a remaining area excluding the exposed area of the lower substrate, an upper touch pad unit formed on the upper substrate so as to correspond to the lower touch pad unit, a first connection electrode formed so as to be in direct contact with the lower touch pad unit, a second connection electrode formed to be opposite to the first connection electrode and to be in direct contact with the upper touch pad unit, and a self-assembly contact member disposed between the first connection electrode and the second connection electrode so as to electrically connect the first connection electrode and the second connection electrode.

The organic light emitting display device may further comprise a thin film transistor formed in the display area of the lower substrate, an organic light emitting diode disposed on the thin film transistor, a filler unit filled in a space between the upper substrate and the organic light emitting diode, and a dam structure enclosing the filler unit in the non-display area, wherein the upper touch pad unit is disposed between the dam structure and the exposed area.

The organic light emitting display device may further comprise a first connection pad unit and a second connection pad unit formed in the exposed area of the lower substrate, first connection pad unit is connected to the thin film transistor and first connection pad unit is connected to the lower touch pad unit.

The organic light emitting display device may further comprise a touch sensor formed on the upper substrate so as to correspond to the display area, and a touch line electrically connecting the touch sensor and the upper touch pad unit.

The first connection electrode and the second connection electrode may be formed of any one or an alloy of two or more of copper (Cu), silver (Ag), gold (Au), and aluminum (Al).

The first connection electrode and the second connection electrode may have a plate shape, a pillar shape, or a pyramid shape with a cut upper portion to have a flat surface thereon.

Heights of the first connection electrode and the second connection electrode may be 0.1 μm to 8 μm, respectively.

The self-assembly contact member may be formed by melting and assembling solder particles.

The solder particles may be alloy particles formed of two or more materials selected from a group consisting of silver, copper, lead, bismuth, zinc, tin, and indium.

The organic light emitting display device may further comprise a sealing member formed in the non-display area and is disposed so as to enclose side surfaces of the first connection electrode, the self-assembly contact member, and the second connection electrode.

The sealing member may be formed to be filled between the first connection electrode, the self-assembly contact member, and the second connection electrode which are adjacent to each other and the sealing member extends to cover at least a part of a side surface of the upper substrate corresponding to the non-display area adjacent to the exposed area.

A distance between the upper touch pad and the lower touch pad may be 10 μm to 100 μm.

According to another aspect of the present disclosure, a manufacturing method of an organic light emitting display device includes: preparing a lower substrate including a plurality of sub-pixels and having a display area, a non-display area enclosing the display area, and an exposed area extending from one side of the non-display area; forming a lower touch pad unit in the non-display area so as to be adjacent to the exposed area; forming an upper touch pad unit corresponding to the lower touch pad unit, a touch sensor corresponding to the display area, and a touch line connecting the touch sensor and the upper touch pad unit on an upper substrate; patterning a first connection electrode on the lower touch pad unit so as to be in contact with the lower touch pad unit and patterning a second connection electrode on the upper touch pad unit so as to be in contact with the upper touch pad unit; applying a self-assembly composition including solder particles on the lower touch pad unit; disposing and attaching the lower substrate and the upper substrate such that the first connection electrode and the second connection electrode are opposite to each other; and forming the self-assembly contact member between the lower touch pad unit and the upper touch pad unit by heating the self-assembly composition.

The first connection electrode and the second connection electrode may be patterned to have heights of 0.1 μm to 8 μm, respectively.

The first connection electrode and the second connection electrode may be formed of any one or an alloy of two or more of copper (Cu), silver (Ag), gold (Au), and aluminum (Al) and the solder particles may be alloy particles formed of two or more materials selected from a group consisting of silver, copper, lead, bismuth, zinc, tin, and indium.

The manufacturing method of an organic light emitting display device may further comprise before the disposing and attaching of the lower substrate and the upper substrate, forming a dam structure so as to enclose the display area in the non-display area of the lower substrate: and filling an adhesive in the dam structure, wherein the forming of the self-assembly contact member includes heating all the display area and the non-display area.

The manufacturing method of an organic light emitting display device may further comprise after the forming of the self-assembly contact member, applying a pressure from the upper substrate to the lower substrate, applying a sealing composition in the non-display area so as to be in contact with all side surfaces of the first connection electrode, the self-assembly contact member, and the second connection electrode while maintaining the pressure, and hardening the sealing composition.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device comprising:
    a lower substrate including a plurality of sub-pixels, the lower substrate having a display area, a non-display area enclosing the display area, and an exposed area extending from one side of the non-display area;
    a lower touch pad unit formed in the non-display area, the lower touch pad unit adjacent to the exposed area on the lower substrate;
    an upper substrate opposite to a remaining area excluding the exposed area of the lower substrate;
    an upper touch pad unit on the upper substrate, the upper touch pad unit corresponding to the lower touch pad unit;
    a first connection electrode in direct contact with the lower touch pad unit;
    a second connection electrode opposite to the first connection electrode and in direct contact with the upper touch pad unit;
    a self-assembly contact member disposed between the first connection electrode and the second connection electrode, the self-assembly contact member electrically connecting together the first connection electrode and the second connection electrode; and
    a first connection pad unit and a second connection pad unit in the exposed area of the lower substrate,
    wherein the first connection pad unit is connected to a thin film transistor formed in the display area of the lower substrate, and the second connection pad unit is connected to the lower touch pad unit.

2. The organic light emitting display device according to claim 1, further comprising:
    an organic light emitting diode disposed on the thin film transistor;
    a filler unit filled in a space between the upper substrate and the organic light emitting diode; and
    a dam structure enclosing the filler unit in the non-display area,
    wherein the upper touch pad unit is disposed between the dam structure and the exposed area.

3. The organic light emitting display device according to claim 1, further comprising:
    a touch sensor on the upper substrate, the touch sensor corresponding to the display area; and
    a touch line electrically connecting the touch sensor and the upper touch pad unit.

4. The organic light emitting display device according to claim 1, wherein the first connection electrode and the second connection electrode are formed of any one or an alloy of two or more of copper (Cu), silver (Ag), gold (Au), or aluminum (Al).

5. The organic light emitting display device according to claim 1, wherein the first connection electrode and the second connection electrode have a plate shape, a pillar shape, or a pyramid shape with a cut upper portion to have a flat surface thereon.

6. The organic light emitting display device according to claim 1, wherein heights of the first connection electrode and the second connection electrode are 0.1 μm to 8 μm.

7. The organic light emitting display device according to claim 1, wherein the self-assembly contact member comprises melted and assembled solder particles.

8. The organic light emitting display device according to claim 7, wherein the solder particles are alloy particles formed of two or more materials selected from a group consisting of silver, copper, lead, bismuth, zinc, tin, and indium.

9. The organic light emitting display device according to claim 1, wherein a distance between the upper touch pad unit and the lower touch pad unit is in a range of 10 μm to 100 μm.

10. An organic light emitting display device comprising:
a lower substrate including a plurality of sub-pixels, the lower substrate having a display area, a non-display area enclosing the display area, and an exposed area extending from one side of the non-display area;
a lower touch pad unit formed in the non-display area, the lower touch pad unit adjacent to the exposed area on the lower substrate;
an upper substrate opposite to a remaining area excluding the exposed area of the lower substrate;
an upper touch pad unit on the upper substrate, the upper touch pad unit corresponding to the lower touch pad unit;
a first connection electrode in direct contact with the lower touch pad unit;
a second connection electrode opposite to the first connection electrode and in direct contact with the upper touch pad unit;
a self-assembly contact member disposed between the first connection electrode and the second connection electrode, the self-assembly contact member electrically connecting together the first connection electrode and the second connection electrode; and
a sealing member in the non-display area and encloses side surfaces of the first connection electrode, the self-assembly contact member, and the second connection electrode.

11. The organic light emitting display device according to claim 10, wherein the sealing member is between the first connection electrode, the self-assembly contact member, and the second connection electrode which are adjacent to each other, and the sealing member extends to cover at least a part of a side surface of the upper substrate corresponding to the non-display area adjacent to the exposed area.

12. A manufacturing method of an organic light emitting display device, comprising:
preparing a lower substrate including a plurality of sub-pixels, the lower substrate having a display area, a non-display area enclosing the display area, and an exposed area extending from one side of the non-display area;
forming a lower touch pad unit in the non-display area, the lower touch pad unit adjacent to the exposed area;
forming a first connection pad unit and a second connection pad unit in the exposed area of the lower substrate;
forming an upper touch pad unit corresponding to the lower touch pad unit, a touch sensor corresponding to the display area, and a touch line connecting the touch sensor and the upper touch pad unit, on an upper substrate;
patterning a first connection electrode on the lower touch pad unit that is in contact with the lower touch pad unit and patterning a second connection electrode on the upper touch pad unit that is in contact with the upper touch pad unit;
applying a self-assembly composition including solder particles on the lower touch pad unit;
disposing and attaching the lower substrate and the upper substrate such that the first connection electrode and the second connection electrode are opposite to each other; and
forming a self-assembly contact member between the lower touch pad unit and the upper touch pad unit by heating the self-assembly composition,
wherein the first connection pad unit is connected to a thin film transistor formed in the display area of the lower substrate, and the second connection pad unit is connected to the lower touch pad unit.

13. The manufacturing method of an organic light emitting display device according to claim 12, wherein the first connection electrode and the second connection electrode are patterned to have heights of 0.1 μm to 8 μm.

14. The manufacturing method of an organic light emitting display device according to claim 12, wherein the first connection electrode and the second connection electrode are formed of any one or an alloy of two or more of copper (Cu), silver (Ag), gold (Au), and aluminum (Al) and the solder particles are alloy particles formed of two or more materials selected from a group consisting of silver, copper, lead, bismuth, zinc, tin, and indium.

15. The manufacturing method of an organic light emitting display device according to claim 12, further comprising:
before the disposing and attaching of the lower substrate and the upper substrate;
forming a dam structure that encloses the display area in the non-display area of the lower substrate; and
filling an adhesive in the dam structure,
wherein the forming of the self-assembly contact member includes heating the display area and the non-display area.

16. The manufacturing method of an organic light emitting display device according to claim 12, further comprising:
after the forming of the self-assembly contact member:
applying a pressure from the upper substrate to the lower substrate;
applying a sealing composition in the non-display area that is in contact with all side surfaces of the first connection electrode, the self-assembly contact member, and the second connection electrode while maintaining the pressure; and
hardening the sealing composition.

* * * * *